United States Patent
Nishimura et al.

(10) Patent No.: US 11,469,318 B2
(45) Date of Patent: Oct. 11, 2022

(54) SUPERJUNCTION SEMICONDUCTOR DEVICE HAVING PARALLEL PN STRUCTURE WITH COLUMN STRUCTURE AND METHOD OF MANUFACTURING THE SAME

(71) Applicant: FUJI ELECTRIC CO., LTD., Kawasaki (JP)

(72) Inventors: Takeyoshi Nishimura, Matsumoto (JP); Ryo Maeta, Matsumoto (JP); Isamu Sugai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/836,212

(22) Filed: Mar. 31, 2020

(65) Prior Publication Data
US 2020/0365719 A1 Nov. 19, 2020

(30) Foreign Application Priority Data
May 15, 2019 (JP) .............................. JP2019-092452

(51) Int. Cl.
*H01L 29/78* (2006.01)
*H01L 29/66* (2006.01)
*H01L 29/10* (2006.01)
*H01L 29/06* (2006.01)

(52) U.S. Cl.
CPC ...... *H01L 29/7802* (2013.01); *H01L 29/0634* (2013.01); *H01L 29/1095* (2013.01); *H01L 29/66712* (2013.01)

(58) Field of Classification Search
CPC .......... H01L 29/7802; H01L 29/66712; H01L 29/1095; H01L 29/0634; H01L 29/0638;
(Continued)

(56) References Cited

U.S. PATENT DOCUMENTS

| 9,368,575 B2 * | 6/2016 | Miyajima | ........... H01L 29/0684 |
| 2008/0001217 A1 * | 1/2008 | Kawashima | ........ H01L 29/0634 257/330 |

(Continued)

FOREIGN PATENT DOCUMENTS

| JP | 2008-210899 A | 9/2008 |
| JP | 2017-037997 A | 2/2017 |
| JP | 6207676 B2 | 10/2017 |

*Primary Examiner* — Mohammad M Hoque
(74) *Attorney, Agent, or Firm* — Rabin & Berdo, P.C.

(57) ABSTRACT

A semiconductor device has an active region through which current passes and an edge termination structure region. On a front surface of a semiconductor substrate of a first conductivity type, a first semiconductor layer of the first conductivity type is provided. On a surface of the first semiconductor layer, a parallel pn structure including first columns of the first conductivity type and second columns of a second conductivity type disposed to repeatedly alternate one another is provided. The second columns in the active region include first regions and second regions. A distance from the front surface of the semiconductor substrate to a bottom surface of one of the first regions is greater than a distance from the front surface of the semiconductor substrate to a bottom surface of one of the second regions.

14 Claims, 13 Drawing Sheets

(58) Field of Classification Search
CPC .......... H01L 29/66734; H01L 29/0615; H01L 29/7813; H01L 29/7811; H01L 29/66348; H01L 29/0619; H01L 29/7397; H01L 29/0696; H01L 29/0603; H01L 29/0684; H01L 29/78; H01L 29/66477
USPC ........................................................ 257/330
See application file for complete search history.

(56) References Cited

U.S. PATENT DOCUMENTS

| | | | | |
|---|---|---|---|---|
| 2008/0246084 | A1* | 10/2008 | Ono .................. | H01L 29/66712 257/341 |
| 2009/0079002 | A1* | 3/2009 | Lee .................... | H01L 29/66712 257/355 |
| 2010/0230715 | A1* | 9/2010 | Mauder .............. | H01L 29/0634 257/139 |
| 2012/0273916 | A1* | 11/2012 | Yedinak ............. | H01L 29/0634 257/471 |
| 2012/0326226 | A1* | 12/2012 | Xiao .................. | H01L 29/0878 257/329 |
| 2014/0035002 | A1* | 2/2014 | Cao .................... | H01L 29/7811 257/192 |
| 2014/0231912 | A1* | 8/2014 | Willmeroth ......... | H01L 29/0634 257/339 |
| 2014/0306283 | A1* | 10/2014 | Nakajima ........... | H01L 29/0834 257/329 |
| 2017/0047321 | A1 | 2/2017 | Nishimura | |
| 2017/0263755 | A1* | 9/2017 | Kudou ................ | H01L 29/7813 |
| 2018/0261691 | A1* | 9/2018 | Harrington, III ........................... | H01L 21/02016 |

* cited by examiner

United States Patent US 11,469,318 B2

SUPERJUNCTION SEMICONDUCTOR DEVICE HAVING PARALLEL PN STRUCTURE WITH COLUMN STRUCTURE AND METHOD OF MANUFACTURING THE SAME

CROSS REFERENCE TO RELATED APPLICATIONS

This application is based upon and claims the benefit of priority of the prior Japanese Patent Application No. 2019-092452, filed on May 15, 2019, the entire contents of which are incorporated herein by reference.

BACKGROUND OF THE INVENTION

1. Field of the Invention

Embodiments of the invention relate to a superjunction semiconductor device and method of manufacturing a superjunction semiconductor device.

2. Description of the Related Art

In a general vertical n-type-channel metal oxide semiconductor field effect transistor (MOSFET), among plural semiconductor layers formed in a semiconductor substrate, the semiconductor layer having a resistance that is highest is an n-type conductive layer (drift layer). Electrical resistance of this n-type drift layer greatly affects ON resistance of the vertical MOSFET overall. Reduction of the ON resistance of the vertical MOSFET overall may be realized by reducing a thickness of the n-type drift layer and thereby, shortening a current path.

Nonetheless, the vertical MOSFET has a function of sustaining breakdown voltage by the spreading of a depletion layer to the high-resistance n-type drift layer in an OFF state. Therefore, when the n-type drift layer is made thinner to reduce the ON resistance, a distance that the depletion layer spreads during the OFF state decreases, whereby critical electric field strength is easily reached by application of low voltage and the breakdown voltage decreases. On the other hand, to increase the breakdown voltage of the vertical MOSFET, the thickness of the n-type drift layer has to be increased, whereby the ON resistance increases. This type of relationship between the ON resistance and the breakdown voltage is called a tradeoff relationship and in general, it is difficult to enhance both counterparts having a tradeoff relationship. The tradeoff relationship between the ON resistance and the breakdown resistance is known to similarly exist in semiconductor devices such as insulated gate bipolar transistors (IGBTs), bipolar transistors, and diodes.

A superjunction (SJ) structure is known as a structure of a semiconductor device that solves the problems described above. For example, a MOSFET (hereinafter, SJ-MOSFET) having a superjunction structure is known. FIG. 23 is a cross-sectional view of a structure of a conventional SJ-MOSFET.

As depicted in FIG. 23, in a SJ-MOSFET 150, an n-type layer 102 is grown on an n$^+$-type semiconductor substrate 101 having a high impurity concentration. At a depth not reaching the n$^+$-type semiconductor substrate 101 from a surface of the n-type layer 102, p-type columns 104 are provided. Bottoms of the p-type columns 104 reach an n-type buffer layer 102' provided between the n$^+$-type semiconductor substrate 101 and the n-type layer 102. In FIG. 23, while the p-type columns 104 do not reach the n$^+$-type semiconductor substrate 101, the p-type columns 104 may reach the n$^+$-type semiconductor substrate 101.

Further, the SJ-MOSFET 150 has a parallel structure (hereinafter, parallel pn region 120) in which in the n-type layer 102, p-type regions (the p-type columns 104) and n-type regions (portions of the n-type layer 102 each sandwiched by the p-type columns 104 adjacent to each other, hereinafter, n-type column regions 103) are disposed to repeatedly alternate each other in a plane parallel to a substrate main surface, the p-type columns 104 and the n-type column regions 103 extending in a direction orthogonal to a substrate main surface and having a narrow width in a plane parallel to the substrate main surface. The p-type columns 104 and the n-type column regions 103 configuring the parallel pn region 120 are regions having impurity concentrations that are increased corresponding to the n-type layer 102. In the parallel pn region 120, impurity concentrations included in the p-type columns 104 and the n-type column regions 103 are set to be substantially equal, whereby during an OFF state, from PN junctions between the p-type columns 104 and the n-type column regions 103 configured according to a cell pitch, a depletion layer spreads in the p-type columns 104 and the n-type column regions 103 along a horizontal direction (direction along which the p-type columns 104 and the n-type column regions 103 are disposed to repeatedly alternate one other). The cell pitch is an interval between adjacent gate electrodes. As a result, the depletion layer is easily connected in the horizontal direction, enabling high breakdown voltage to be achieved. Therefore, even when the impurity concentration of the n-type column regions 103 is increased, it becomes possible to reduce ON resistance without the breakdown voltage decreasing.

On a portion of the parallel pn region 120 in an active region 130 of the SJ-MOSFET 150, the active region 130 in which an element is formed and through which current flows during an ON state, a p-type base region 105 is provided. In the p-type base region 105, n$^+$-type source regions 106 are provided. The n$^+$-type source regions 106 are provided in the active region 130 and are disposed in a trench gate structure described hereinafter.

Further, trenches 118 that penetrate the p-type base region 105 and the n$^+$-type source regions 106, and reach the n-type column regions 103 are provided. The n$^+$-type source regions 106 are disposed so as to be in contact with side surfaces of the trenches 118.

Inner wall surfaces of the trenches 118 are covered by a gate insulating film 107 formed by an oxide film, etc. and the trenches 118 are embedded respectively with gate electrodes 108 that are formed on a surface of the gate insulating film 107. In this manner, the trench gate structure is configured. A portion of each of the gate electrodes 108 may be provided with gate wiring 115 that protrudes from a top (side where a source electrode 10 described hereinafter is provided) of the trenches 118 toward the source electrode 110.

Further, on surfaces of the p-type base region 105 and the n$^+$-type source regions 106 and surfaces of the gate electrodes 108, the source electrode 110 is provided via an interlayer insulating film 109. The source electrode 110 is electrically insulated on the interlayer insulating film 109. Through contact holes formed in the interlayer insulating film 109, the source electrode 110 is electrically in contact with the p-type base region 105 and the n$^+$-type source regions 106. At a perimeter of the source electrode 110, gate metal wiring 114 is provided so as to surround the source electrode 110. The gate metal wiring 114 is embedded in an opening 116 provided in the interlayer insulating film 109 above the gate wiring 115 and is electrically connected to the gate electrodes 108 via the gate wiring 115.

Further, on a back surface side of the n⁺-type semiconductor substrate 101, a drain electrode (not depicted) that is electrically connected to the n⁺-type semiconductor substrate 101 is formed. By such a structure, a MOSFET having an enhancement-type trench gate structure of an n-channel type is formed.

In an edge termination region 140 the SJ-MOSFET 150, the edge termination region 140 surrounding a periphery of the active region 130, the parallel pn region 120 is provided in the n-type layer 102, similarly to the active region 130, and on a back surface of the n⁺-type semiconductor substrate 101, the drain electrode (not depicted) is provided. The edge termination region 140 is formed by a breakdown voltage sustaining region 144 that mitigates electric field on a semiconductor-base-front-side of a drift region and sustains breakdown voltage and a border region 143 that is between the breakdown voltage sustaining region 144 and the active region 130. Further, in the breakdown voltage sustaining region 144, from a portion beneath the gate wiring 115 and spanning to an outer periphery of the breakdown voltage sustaining region 144, for example, a thick insulating film 117 such as a LOCOS film may be provided. In a length direction of the p-type columns 104, spanning the breakdown voltage sustaining region 144 from the border region 143, a p-type region 125 deeper (longer) than the p-type base region 105 is provided.

For example, as a superjunction semiconductor device, a commonly known semiconductor device includes first semiconductor regions each having lower portions facing each other across a second semiconductor region and in contact with a main surface of a first semiconductor layer, and a third semiconductor region provided between the adjacent first semiconductor regions and having a lower portion that forms a pn junction with the second semiconductor region (for example, refer to Japanese Laid-Open Patent Publication No. 2008-210899).

SUMMARY OF THE INVENTION

According to an embodiment, a superjunction semiconductor device has an active region through which current passes, and an edge termination structure region disposed at an outer side of the active region and in which a voltage withstanding structure that surrounds a periphery of the active region is formed. The superjunction semiconductor device includes a semiconductor substrate of a first conductivity type, having a front surface and a back surface opposite to the front surface, a first semiconductor layer of the first conductivity type, provided on the front surface of the semiconductor substrate and having an impurity concentration that is lower than an impurity concentration of the semiconductor substrate, a parallel pn structure provided on a surface of the first semiconductor layer and including a plurality of first columns of the first conductivity type and a plurality of second columns of a second conductivity type, the first columns and the second columns being disposed to repeatedly alternate with one another on a plane parallel to the front surface, a first semiconductor region of the second conductivity type, provided on a surface of the parallel pn structure in the active region, a second semiconductor region of the first conductivity type, selectively provided in a surface layer of the first semiconductor region in the active region, a gate insulating film having a first surface in contact with the first semiconductor region and a second surface opposite to the first surface, and a gate electrode provided on the second surface of the gate insulating film. The plurality of second columns in the active region includes at least one first region each having a bottom surface and at least one second region each having a bottom surface, a first distance from the front surface of the semiconductor substrate to the bottom surface of one of the at least one first region is greater than a second distance from the front surface of the semiconductor substrate to the bottom surface of one of the at least one second region.

In the embodiment, the superjunction semiconductor device further includes a trench penetrating the first semiconductor region and the second semiconductor region, and reaching a corresponding one of the at least one first column. The gate electrode is provided on the gate insulating film in the trench.

In the embodiment, the at least one first region includes a plurality of first regions that are disposed in alignment, with a constant interval between adjacent first regions among the plurality of first regions.

In the embodiment, the superjunction semiconductor device further includes a current detecting region having the first semiconductor layer, the parallel pn structure, the first semiconductor region, the second semiconductor region, the gate insulating film, and the gate electrode. The plurality of second columns of the current detecting region includes a third region having a bottom surface and a fourth region having a bottom surface, a third distance from the front surface of the semiconductor substrate to the bottom surface of the third region is greater than a fourth distance from the front surface of the semiconductor substrate to the bottom surface of the fourth region.

In the embodiment, a volume of the plurality of second columns in the active region is at least 90% of a volume of the plurality of first columns in the active region.

According to another embodiment, a method of manufacturing a superjunction semiconductor device having an active region through which current passes, and an edge termination structure region disposed at an outer side of the active region and in which a voltage withstanding structure that surrounds a periphery of the active region is formed, the method includes forming a first semiconductor layer of a first conductivity type on a front surface of a semiconductor substrate of the first conductivity type, the first semiconductor layer having an impurity concentration lower than an impurity concentration of the semiconductor substrate; forming a parallel pn structure on a surface of the first semiconductor layer, the parallel pn structure including a plurality of first columns of the first conductivity type and a plurality of second columns of a second conductivity type, the first columns and the second columns being disposed to repeatedly alternate with one another on a plane parallel to the front surface; forming a first semiconductor region of the second conductivity type, on a surface of the parallel pn structure in the active region; selectively forming a second semiconductor region of the first conductivity type, in a surface layer of the first semiconductor region in the active region; forming a gate insulating film having a first surface in contact with the first semiconductor region and a second surface opposite to the first surface; and forming a gate electrode on the second surface of the gate insulating film. The plurality of second columns in the active region is formed to include a first region having a bottom surface and a second region having a bottom surface, and a first distance from the front surface of the semiconductor substrate to the bottom surface of the first region is greater than a second distance from the front surface of the semiconductor substrate to the bottom surface of the second region.

According to another embodiment, a method of manufacturing a superjunction semiconductor device having an active region through which current passes, and an edge termination structure region disposed at an outer side of the active region and in which a voltage withstanding structure that surrounds a periphery of the active region is formed, the method includes forming a first semiconductor layer of a first conductivity type on a front surface of a semiconductor substrate of the first conductivity type, the first semiconductor layer having an impurity concentration lower than an impurity concentration of the semiconductor substrate; forming a parallel pn structure on a surface of the first semiconductor layer, the parallel pn structure including a plurality of first columns of the first conductivity type and a plurality of second columns of a second conductivity type, the first columns and the second columns being disposed to repeatedly alternate with one another on a plane parallel to the front surface; forming a plurality of trenches from an upper surface of the parallel pn structure in the active region, in a direction toward the semiconductor substrate to selectively reach the plurality of first columns; forming a gate insulating film along a contour of each of the plurality of trenches; forming a plurality of gate electrodes on a surface of the gate insulating film; forming a first semiconductor region of the second conductivity type, on a surface of the parallel pn structure in the active region, the first semiconductor region having a surface layer on a first side thereof opposite a second side thereof facing the semiconductor substrate; and selectively forming a plurality of second semiconductor regions of the first conductivity type, in the surface layer of the first semiconductor region so that each is in contact with a corresponding trench of the plurality of trenches. The plurality of second columns in the active region is formed to include a first region having a bottom surface and a second region having a bottom surface, and a first distance from the front surface of the semiconductor substrate to the bottom surface of the first region is greater than a second distance from the front surface of the semiconductor substrate to the bottom surface of the second region.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques will be discussed. In the parallel pn region 120, when an impurity amount of the n-type column regions 103 is substantially equal to an impurity amount of the p-type columns 104 (state in which a charge balance is "1"), the breakdown voltage of the SJ-MOSFET 150 is a maximal value. Therefore, in the conventional SJ-MOSFET 150, manufacture (fabrication) is such that the impurity amount of the n-type column regions 103 becomes substantially equal to the impurity amount of the p-type columns 104.

Figure 23:
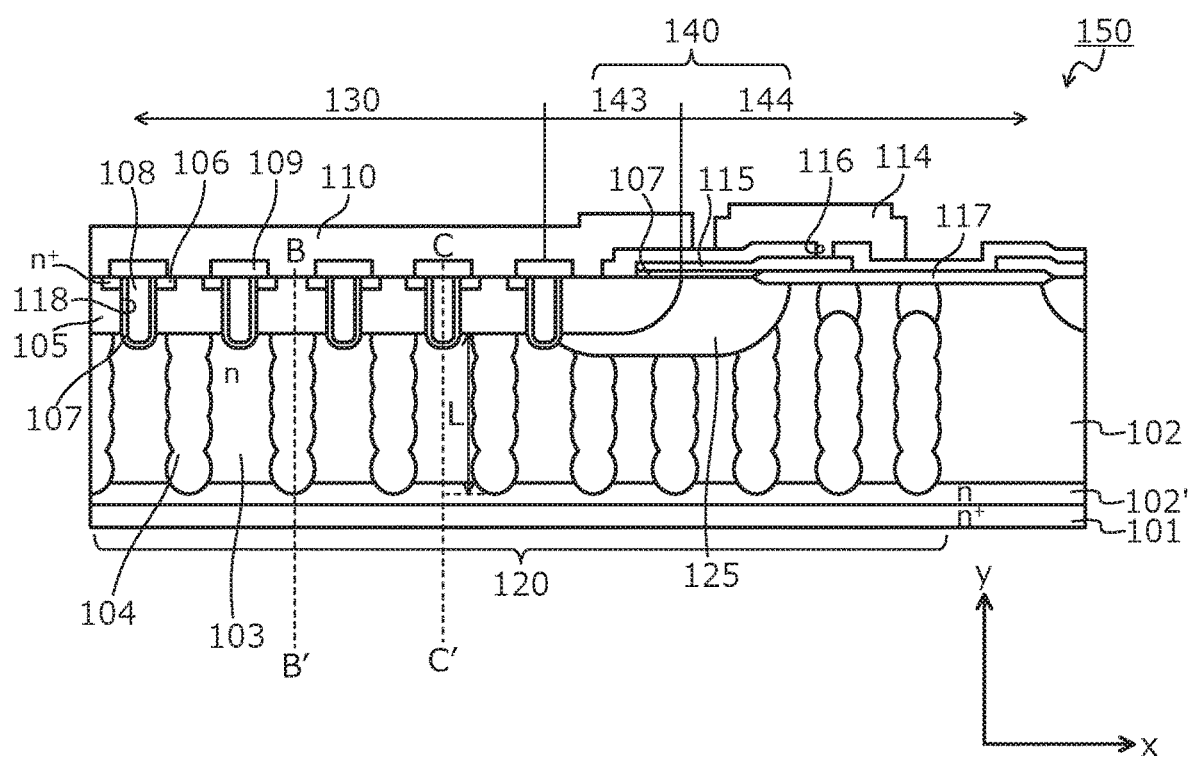
FIG. 23 is a cross-sectional view of a structure of a conventional SJ-MOSFET.
Figure 24:
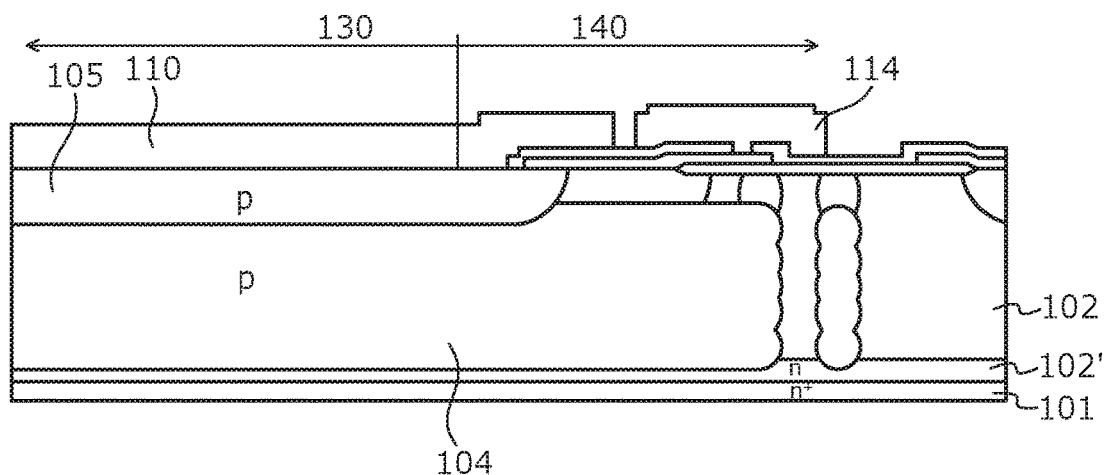
FIG. 24 is a cross-sectional view of a portion along cutting line B-B' in FIG. 23 depicting the structure of the conventional SJ-MOSFET.
Figure 25:
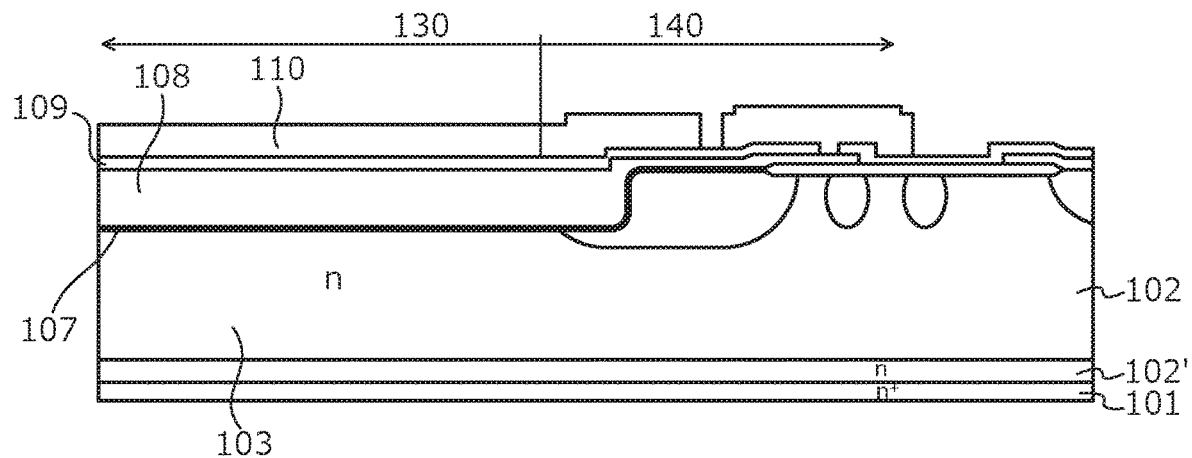
FIG. 25 is a cross-sectional view of a portion along cutting line C-C' in FIG. 23 depicting the structure of the conventional SJ-MOSFET.

FIG. 24 is a cross-sectional view of a portion along cutting line B-B' in FIG. 23 that depicts a structure of the conventional SJ-MOSFET. FIG. 25 is a cross-sectional view of a portion along cutting line C-C' in FIG. 23 depicting the structure of the conventional SJ-MOSFET. In the conventional SJ-MOSFET 150, the n-type column regions 103 and the p-type columns 104 are provided having lengths that are equal to each other in a length direction (a direction orthogonal to an x axis direction and a y axis direction in FIG. 23) of the trenches 118. For example, in the conventional SJ-MOSFET, the state in which the charge balance is "1" is necessary and therefore, the n-type column regions 103 and the p-type columns 104 have equal impurity concentrations and equal lengths.

Nonetheless, in the state where the charge balance is "1", avalanche resistance suddenly decreases. In this case, when avalanche occurs in a region near a channel, avalanche current flows in a parasitic bipolar transistor without passing through drift resistance and a decrease in avalanche resistance becomes remarkable. Therefore, in the conventional semiconductor device, design is performed avoiding a state in which the charge balance is "1" and design is such that characteristics such as the ON resistance are reduced.

Embodiments of a superjunction semiconductor device and a method of manufacturing a superjunction semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 1:
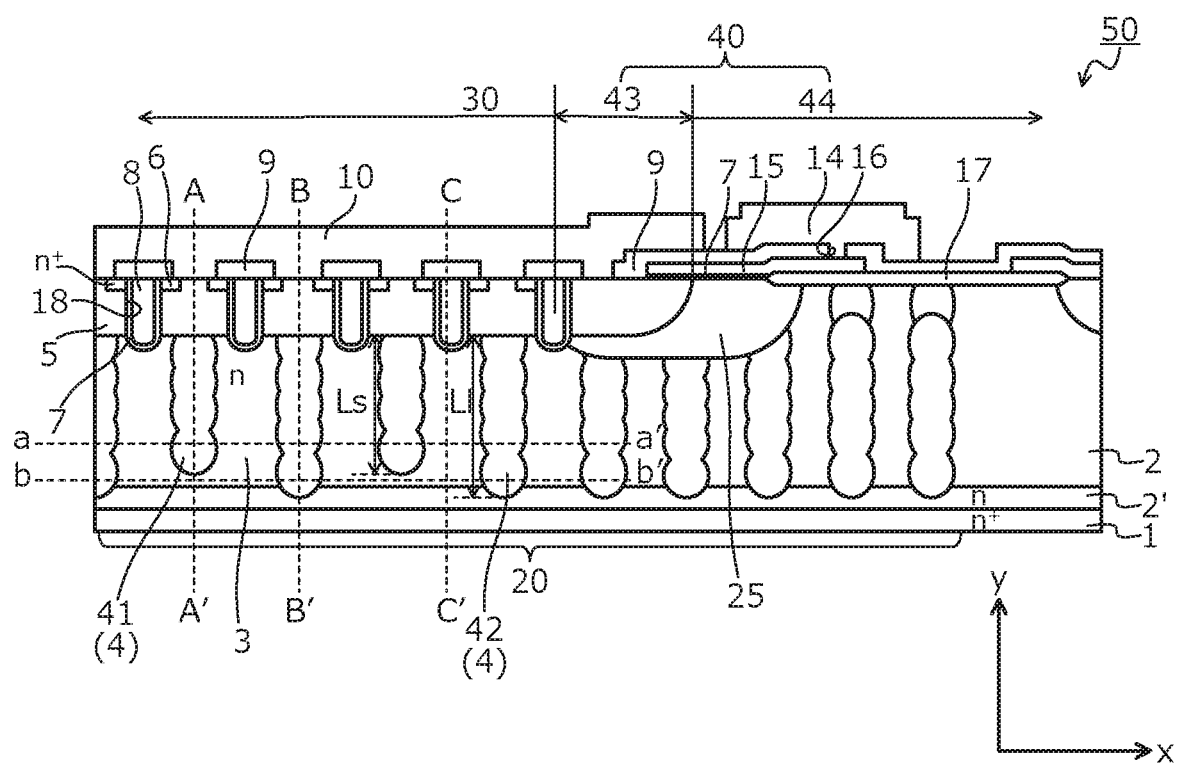
FIG. 1 is a cross-sectional view of a SJ-MOSFET according to an embodiment.

A superjunction semiconductor device according to the present invention will be described taking a SJ-MOSFET as an example. FIG. 1 is a cross-sectional view of a SJ-MOSFET according to an embodiment.

A SJ-MOSFET depicted in FIG. 1 is a SJ-MOSFET 50 that includes metal oxide semiconductor (MOS) gates on a front side (side having a p-type base region 5 described hereinafter) of a semiconductor base (silicon base: semiconductor chip) containing silicon (Si). The SJ-MOSFET 50 includes an active region 30 and an edge termination region 40 that surrounds a periphery of the active region 30. The active region 30 is a region through which current passes in the ON state. The edge termination region 40 is formed by a breakdown voltage sustaining region 44 that mitigates electric field on a semiconductor-base-front-side of a drift region and that sustain breakdown voltage, and a border region 43 between the breakdown voltage sustaining region 44 and the active region 30. A border between the active region 30 and the border region 43 is at a center of a trench 18 having an n$^+$-type source region 6 described hereinafter provided only on one side of the trench 18. Further, a border between the border region 43 and the breakdown voltage sustaining region 44 is an end of the p-type base region 5. In the active region 30 depicted in FIG. 1, while only four unit cells (functional units of an element) are depicted, other unit cells adjacent to these are not depicted.

An n$^+$-type semiconductor substrate (semiconductor substrate of a first conductivity type) 1 is a silicon single crystal substrate doped with, for example, arsenic (As) or phosphorus (P). On the n$^+$-type semiconductor substrate 1, an n-type buffer layer (first semiconductor layer of the first conductivity type) 2' is disposed having an impurity concentration that is lower than an impurity concentration of the n$^+$-type semiconductor substrate 1. The n-type buffer layer 2' is a low-concentration n-type layer doped with, for example, phosphorus. On the n-type buffer layer 2', an n-type layer (first semiconductor layer of the first conductivity type) 2 is provided. The n-type layer 2 has an impurity concentration that is lower than the impurity concentration of the n-type buffer layer 2' and, is a low-concentration n-type layer doped with, for example, phosphorus. Hereinafter, the n$^+$-type semiconductor substrate 1, the n-type buffer layer 2', and the n-type layer 2 collectively are regarded as the semiconductor base. On the front side of the semiconductor base, MOS gate structures (element structures) are formed. Further, on a back surface of the semiconductor base, a drain electrode (not depicted) is provided.

In the active region 30 and the edge termination region 40 of the SJ-MOSFET 50, a parallel pn region 20 is provided. In the parallel pn region 20, n-type column regions 3 and p-type column regions 4 are disposed to repeatedly alternate one other. The p-type column regions 4 are provided from a surface of the n-type layer 2 so as to not reach a surface of the n$^+$-type semiconductor substrate 1. As described hereinafter, each of the n-type column regions 3 and the p-type column regions 4 in the active region 30 and in the edge termination region 40 have a planar shape that is a shape of a stripe or a rectangle. The n-type column regions 3 have an impurity concentration that is higher than the impurity concentration of the n-type buffer layer 2' and lower than the impurity concentration of the n$^+$-type semiconductor substrate 1.

Further, in a surface layer of the n-type layer 2, a p-type base region (first semiconductor region of a second conductivity type) 5 is provided in contact with the p-type column regions 4 and in a surface layer of the p-type base region 5, n$^+$-type source regions (second semiconductor regions of the first conductivity type) 6 are selectively provided.

On a first main side (side having the p-type base region 5) of the semiconductor base, trench structures are formed. In particular, each of the trenches 18 penetrates the p-type base region 5 and one of the n$^+$-type source regions 6, from a surface on a first side (the first main side of the semiconductor base) of the p-type base region 5, opposite to a second side thereof facing the n$^+$-type semiconductor substrate 1, and reaches a corresponding one of the n-type column regions 3. Along inner walls of the trenches 18, a gate insulating film 7 is formed on bottoms and side walls of the trenches 18, and on the gate insulating film 7 in the trenches 18, gate electrodes 8 are formed in the trenches 18, respectively. The gate electrodes 8 are insulated from the n-type column regions 3 and the p-type base region 5 by the gate insulating film 7. A portion of each of the gate electrodes 8 may be provided with gate wiring 15 that protrudes from a top (side where the source electrode 10 described hereinafter is provided) of the trenches 18 toward the source electrode 10. Beneath the gate wiring 15, the gate insulating film 7 is provided. Above the gate wiring 15, an interlayer insulating film 9 is provided.

The interlayer insulating film 9 is provided on an entire surface of the first main side of the semiconductor base so as to cover the gate electrodes 8 respectively embedded in the trenches 18. The source electrode 10 is in contact with the n$^+$-type source regions 6 and the p-type base region 5 through contact holes formed in the interlayer insulating film 9. The source electrode 10 is electrically insulated from the gate electrodes 8 by the interlayer insulating film 9. At a perimeter of the source electrode 10, gate metal wiring 14 is provided so as to surround the source electrode 10. The gate metal wiring 14 is embedded in an opening 16 provided in the interlayer insulating film 9 above the gate wiring 15. As a result, the gate metal wiring 14 is electrically connected to the gate electrodes 8 through the gate wiring 15. Between the source electrode 10 and the interlayer insulating film 9, for example, a barrier metal (not depicted) that prevents metal atoms from diffusing the source electrode 10 toward the gate electrodes 8 may be provided. On the source electrode 10, a protective film (not depicted) such as a passivation film containing, for example, a polyimide, may be selectively provided. In an opening provided in the protective film such as a passivation film provided on the source electrode 10, a region where the source electrode 10 is exposed is a source pad region 11.

In the conventional SJ-MOSFET 150, the state in which the charge balance is "1" is necessary and therefore, the n-type column regions 103 and the p-type columns 104 have equal impurity concentrations and equal lengths. In contrast, in the SJ-MOSFET 50 of the embodiment, as depicted in FIG. 1, short p-type column regions (first region) 41 and long p-type column regions (second region) 42 are provided in the p-type column regions 4 of the active region 30, a length Ls of the short p-type column regions 41 of the p-type column regions 4 is shorter than a length Ll of the long p-type column regions 42 of the p-type column regions 4 (Ls<Ll). Further, as depicted in FIG. 1, while the short p-type column regions 41 of the p-type column regions 4 do not reach the n-type buffer layer 2', the long p-type column regions 42 of the p-type column regions 4 reach the n-type buffer layer 2'. Further, the short p-type column regions 41 and the long p-type column regions 42 of the p-type column regions 4 do not reach the n$^+$-type semiconductor substrate 1. The p-type column regions 4 are in contact with the n-type buffer layer 2' between the n$^+$-type semiconductor substrate 1 and the n-type column regions 3 and thereby, may suppress decreases in the breakdown voltage and increases in the ON resistance.

For example, the length Ll of the long p-type column regions 42 of the p-type column regions 4 is about 6 μm, and the length Ls of the short p-type column regions 41 of the p-type column regions 4 is about 1.2 to 1.8 μm shorter than the length Ll. Here, "length" indicates a depth (length) from an upper surface of one of the p-type column regions 4, i.e., an interface between the one of the p-type column regions 4 and the p-type base region 5, in a direction toward a bottom surface of the one of the p-type column regions 4, i.e., a length from the upper surface to an interface between the one of the p-type column regions 4 and an n-type region (the n-type buffer layer 2' or the n-type layer 2).

Further, due to a presence of the short p-type column regions 41, in the active region 30, a volume of the p-type column regions 4 is less than a volume of the n-type column regions 3. From the perspective of charge balance in the parallel pn region 20, the volume of the p-type column regions 4 in the active region 30 may be at least 90% of the volume of the n-type column regions 3 in the active region.

Further, the short p-type column regions 41 have a structure in which a portion of bottoms of the p-type column regions 4 are not formed. In other words, in the short p-type column regions 41, a distance from bottoms of the p-type column regions 4 to a front surface of the n$^+$-type semiconductor substrate 1 is greater than a distance from bottom surfaces of the long p-type column regions 42 to the front surface of the n$^+$-type semiconductor substrate 1. A length of the p-type column regions 4 in the edge termination region 40 that has the breakdown voltage sustaining region 44 and the border region 43 between the breakdown voltage sustaining region 44 and the active region 30, reaches the n-type buffer layer 2' and does not reach the n$^+$-type semiconductor substrate 1. Therefore, the p-type column regions 4 having a length equal to that of the long p-type column regions 42 provided in the active region 30 are provided.

Further, in the breakdown voltage sustaining region 44, a thick insulating film 17 such as, for example, a LOCOS film may be provided extending to an outer periphery of the breakdown voltage sustaining region 44, from beneath a portion of the gate wiring 15. A p-type region 25 that is deeper (longer) than the p-type base region 5 in a direction of the length of the p-type column regions 4 is provided extending into the breakdown voltage sustaining region 44, from the border region 43. Further, the p-type region 25 has an impurity concentration that is lower than that of the p-type base regions.

The impurity concentrations of the p-type column regions 4 and the n-type column regions 3 are different according to the voltage rating. For example, in a high-voltage (semiconductor device having a breakdown voltage of about 600V) device, the impurity concentrations may be in a range from $1.0\times10^{15}/cm^3$ to $5.0\times10^{16}/cm^3$ and in a low-voltage (semiconductor device having a breakdown voltage of about 100V), the impurity concentrations may be in a range from $1.0\times10^{16}/cm^3$ to $1.0\times10^{17}/cm^3$.

Figure 2:
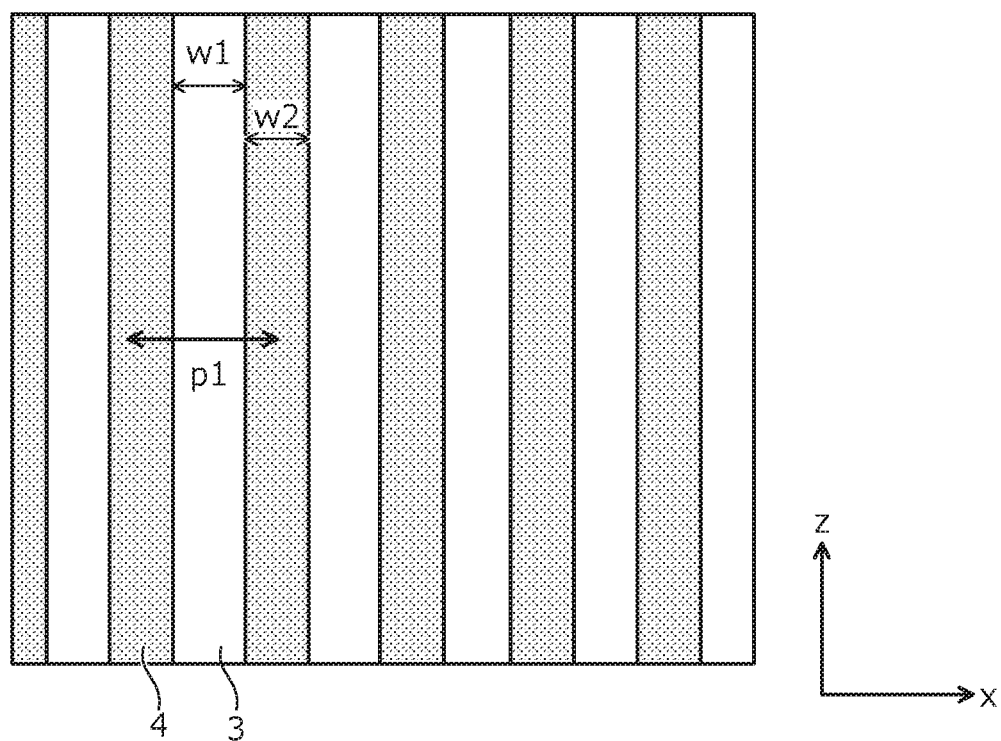
FIG. 2 is a plan view of is a plan view of a portion along cutting line a-a' in FIG. 1 depicting a structure of the SJ-MOSFET according to the embodiment.
Figure 3:
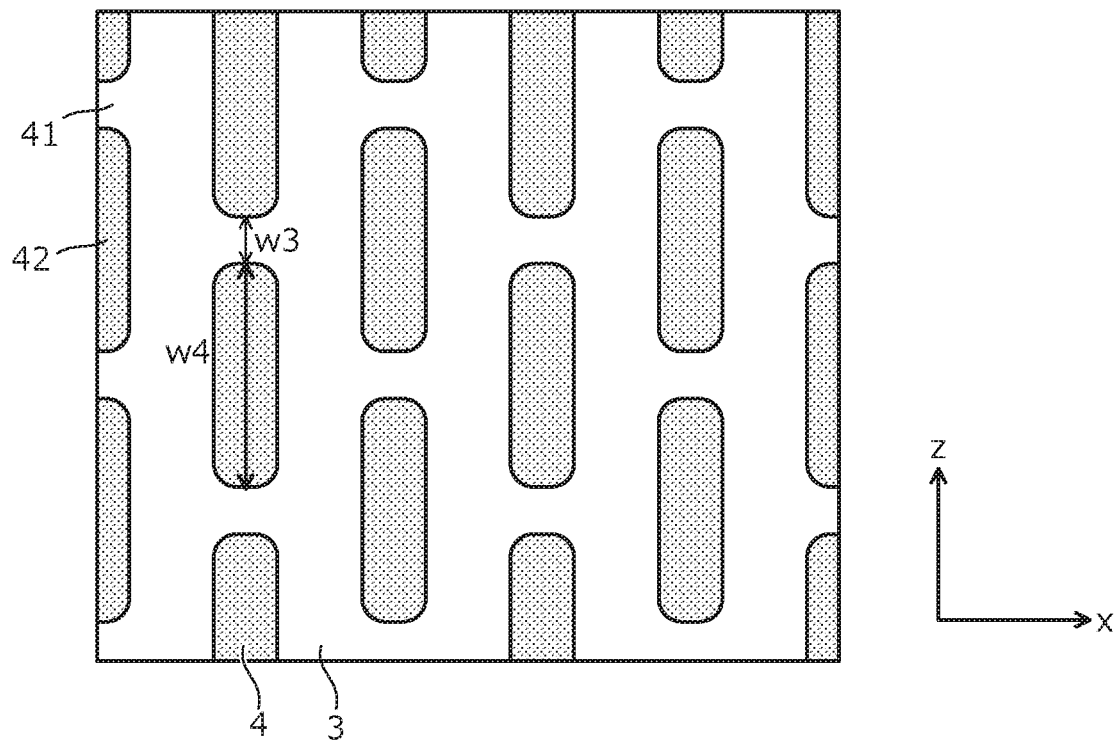
FIG. 3 is a plan view of a portion along cutting line b-b' in FIG. 1 depicting a structure of the SJ-MOSFET according to the embodiment.

FIG. 2 is a plan view of is a plan view of a portion along cutting line a-a' in FIG. 1 depicting a structure of the SJ-MOSFET according to the embodiment. FIG. 3 is a plan view of a portion along cutting line b-b' in FIG. 1 depicting the structure of the SJ-MOSFET according to the embodiment. FIG. 2 is a plan view of a portion closer to the trenches 18 than are the bottoms of the short p-type column regions 41 of the p-type column regions 4. FIG. 3 is a plan view of a portion closer to the n$^+$-type semiconductor substrate 1 than are the bottoms of the short p-type column regions 41 of the p-type column regions 4.

Figure 4A:
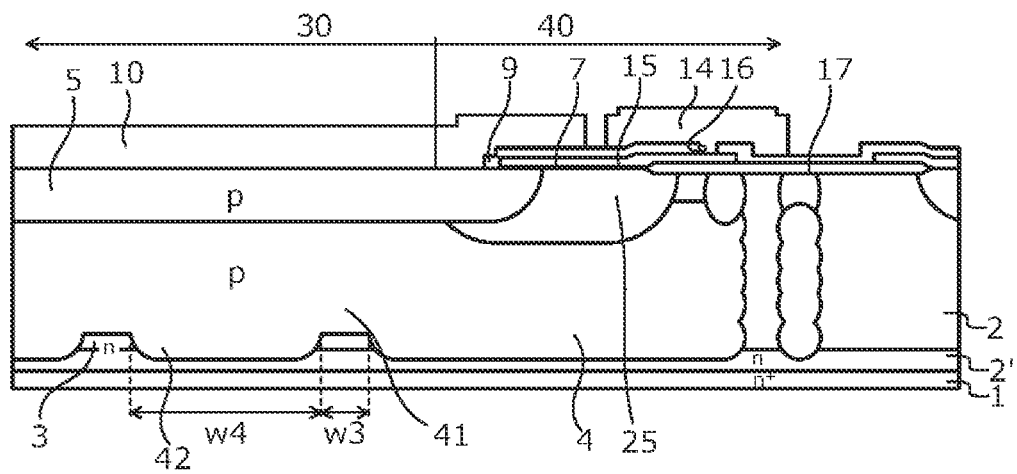
FIG. 4A is a cross-sectional view of a portion along cutting line A-A' in FIG. 1 depicting the structure of the SJ-MOSFET according to the embodiment.
Figure 4B:
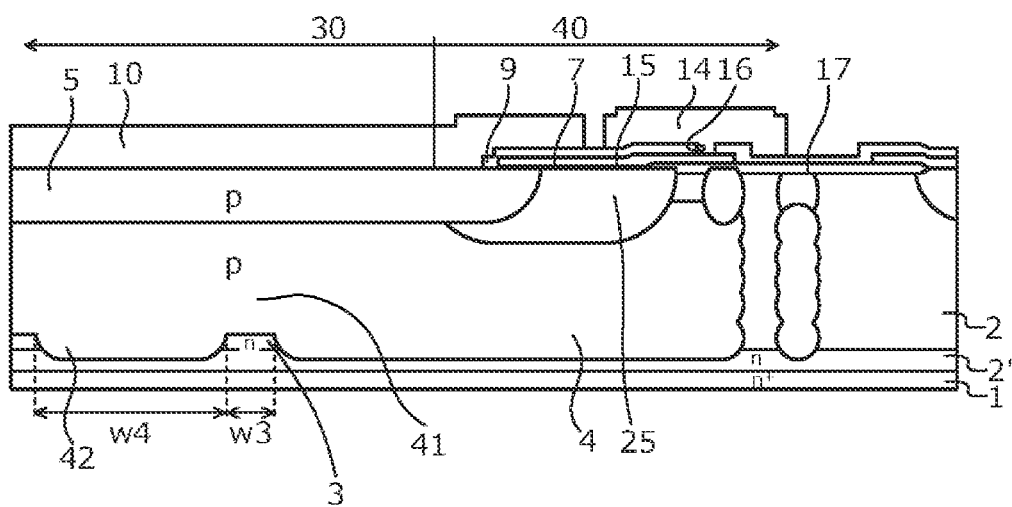
FIG. 4B is a cross-sectional view of a portion along cutting line B-B' in FIG. 1 depicting the structure of the SJ-MOSFET according to the embodiment.
Figure 4C:
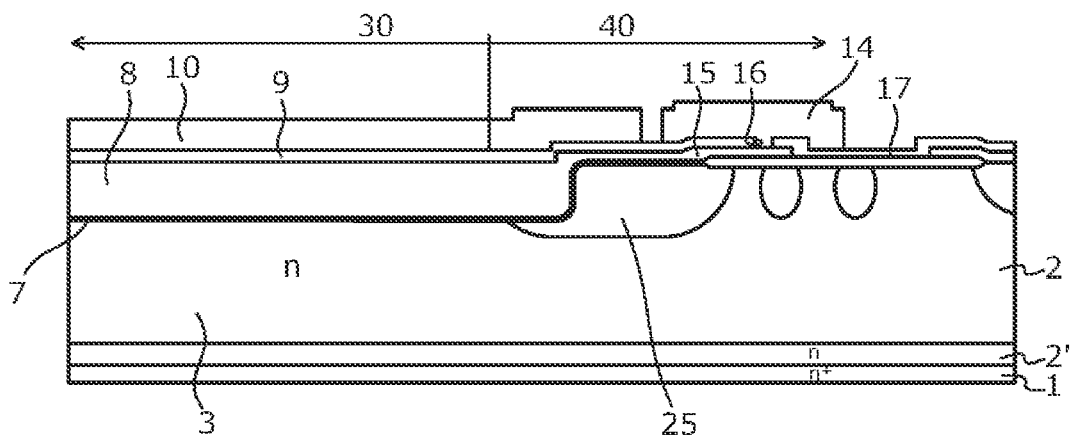
FIG. 4C is a cross-sectional view of a portion along cutting line C-C' in FIG. 1 depicting the structure of the SJ-MOSFET according to the embodiment.

FIG. 4A is a cross-sectional view of a portion along cutting line A-A' in FIG. 1 depicting the structure of the SJ-MOSFET according to the embodiment. FIG. 4B is a cross-sectional view of a portion along cutting line B-B' in FIG. 1 depicting the structure of the SJ-MOSFET according to the embodiment. Further, FIG. 4C is a cross-sectional view of a portion along cutting line C-C' in FIG. 1 depicting the structure of the SJ-MOSFET according to the embodiment.

As depicted in FIGS. 2 and 3, the n-type column regions 3 and the p-type column regions 4 in the active region 30, for example, may be a stripe structure parallel to a length direction (z axis direction) of the trenches 18. Further, in a portion closer to the trenches 18 than are the bottom surfaces of the short p-type column regions 41 in the p-type column regions 4, a width w1 of each of the n-type column regions 3 and a width w2 of each of the p-type column regions 4 may be about equal to one another to create a state in which the charge balance is "1". Further, the width of each of the n-type column regions 3 is a dimension of each of the n-type column regions 3 in a direction (x axis direction) orthogonal to the direction in which the trenches 18 extend and similarly for the width w2 of each of the p-type column regions 4. The width w1 of the n-type column regions 3 and the width w2 of the p-type column regions 4 are different according to the voltage rating of the SJ-MOSFET.

In a portion closer to the n$^+$-type semiconductor substrate 1 than are the bottom surfaces of the short p-type column regions 41 of the p-type column regions 4, as depicted in FIGS. 3, 4A, and 4B, the short p-type column regions 41 and the long p-type column regions 42 may be provided so as to form a pattern in which the short p-type column regions 41 and the long p-type column regions 42 alternate one another in the length direction of the trenches 18. Further, the short p-type column regions 41 may be provided to each have a same width w3 and to have equal intervals (interval w4) between the short p-type column regions 41 that are adjacent to each other. The interval w4 is synonymous with a width of each of the long p-type column regions 42, and a width of each of the short p-type column regions 41 and a width of each of the long p-type column regions 42 are dimensions thereof in the length direction (Z axis direction) of the trenches 18. Further, to reduce decreases in the breakdown voltage, the width w3 of each of the short p-type column regions 41 may be at most equal to an interval P1 of the p-type column regions 4. The interval P1 of the p-type column regions 4 is a distance between a center of one of the p-type column regions 4 and a center of another one of the p-type column regions 4 adjacent to the one. Further, the interval P1 of the p-type column regions 4 is equal to a sum of the width w1 of one of the n-type column regions 3 in the active region 30 and the width w2 of one of the p-type column regions 4 in the active region 30 (P1=w1+w2), and is a pitch at which the n-type column regions 3 and the p-type column regions 4 in the active region 30 repeat.

Figure 5:
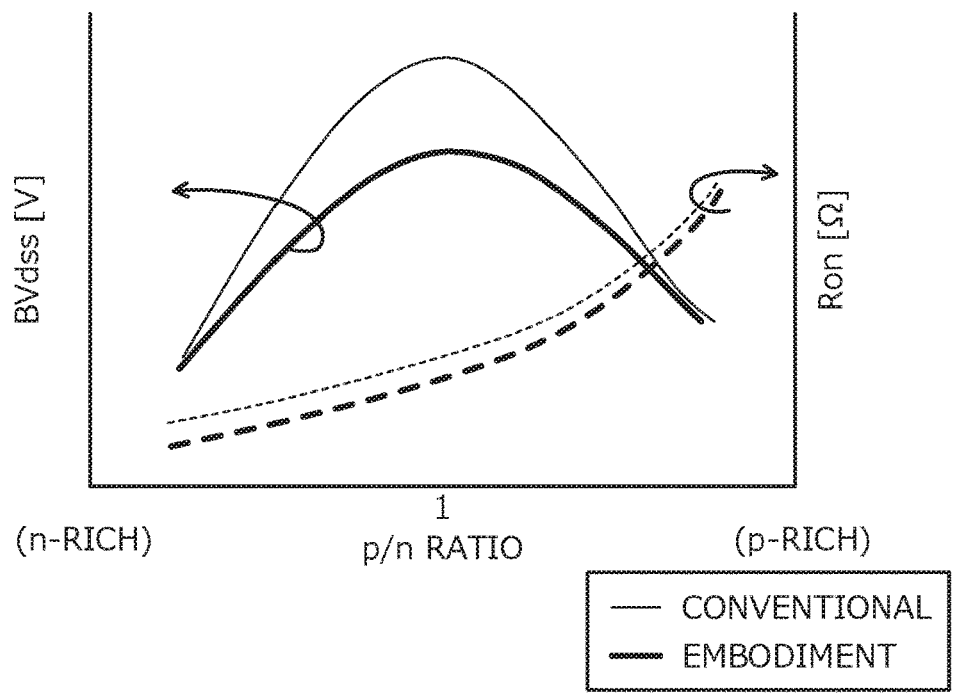
FIG. 5 is a graph of ON resistance and breakdown voltage with respect to charge balance in the SJ-MOSFET according to the embodiment and a conventional SJ-MOSFET.

FIG. 5 is a graph of ON resistance and breakdown voltage with respect to charge balance in the SJ-MOSFET according to the embodiment and the conventional SJ-MOSFET. In FIG. 5, a left vertical axis indicates breakdown voltage (BVdss) of the SJ-MOSFET in units of V. A right vertical axis indicates the ON resistance (Ron) of the SJ-MOSFET in units of Ω. A horizontal axis indicates the charge balance (p/n ratio), indicates a state in which "1" on the horizontal axis is the charge balance "1", indicates a state in which an n-type impurity amount is relatively greater closer to an origin than is "1" (in the drawing (n-rich)), and indicates a state in which a p-type impurity amount is relatively greater further from the origin than is "1" (in the drawing (p-rich)). Further, solid lines represent breakdown voltage and dotted lines represent ON resistance.

As depicted in FIG. 5, in the SJ-MOSFET according to the embodiment, the ON resistance decreases more and the breakdown voltage decreases slightly more as compared to the conventional SJ-MOSFET. This is due to a charge balance in which the n-type impurity amount is greater at a portion where the short p-type column regions 41 are provided. However, the short p-type column regions 41 are partially provided and therefore, the breakdown voltage does not greatly decrease. For example, for a low-voltage rating, the decrease in the breakdown voltage is a few V and for a high-voltage rating, the decrease in the breakdown voltage is a few tens of V. Further, in the edge termination region 40, the structure is similar to that conventionally and therefore, the breakdown voltage of the edge termination region 40 of the SJ-MOSFET 50 according to the embodiment is equal to the breakdown voltage of the edge termination region 140 of the conventional SJ-MOSFET 150.

Further, in the SJ-MOSFET 50 according to the embodiment, even in a state in which the charge balance is biased (state in which either the n-type or the p-type impurity amount is relatively greater), the decrease of the breakdown voltage is smaller than that in the conventional SJ-MOSFET.

Figure 6:
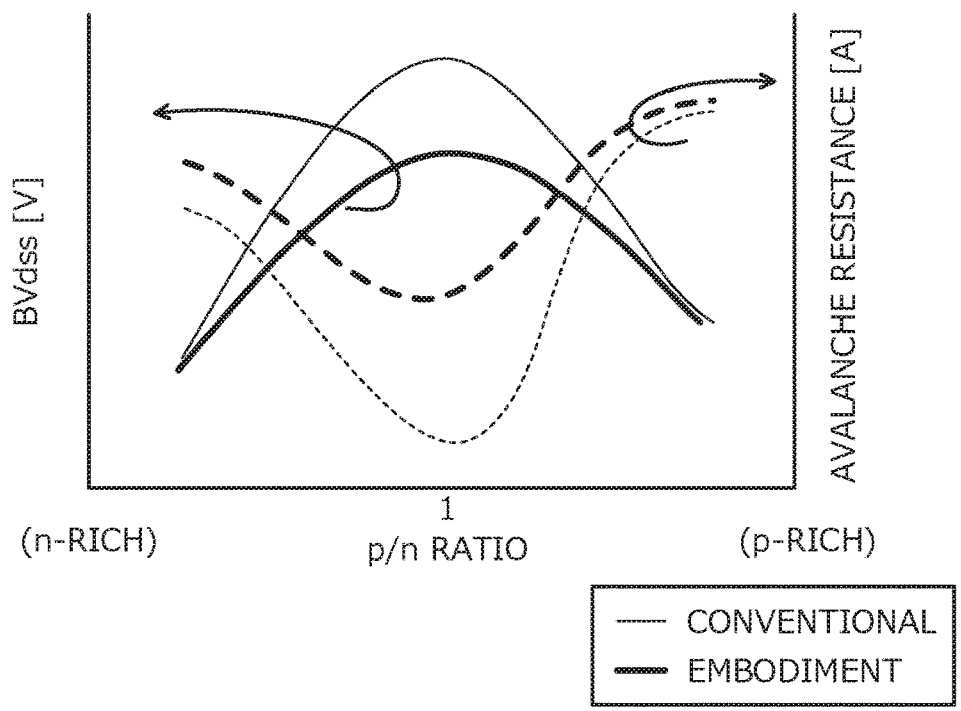
FIG. 6 is a graph of avalanche resistance and breakdown voltage with respect to charge balance in the SJ-MOSFET according to the embodiment and the conventional SJ-MOSFET.

FIG. 6 is a graph of avalanche resistance and breakdown voltage with respect to charge balance in the SJ-MOSFET according to the embodiment and the conventional SJ-MOSFET. In FIG. 6, a left vertical axis indicates breakdown voltage (BVdss) of the SJ-MOSFET in units of V. A right vertical axis indicates avalanche resistance of the SJ-MOS-FET in units of A. Further, a horizontal axis indicates the charge balance (the p/n ratio), indicates a state in which "1" on the horizontal axis is the charge balance "1", indicates a state in which an n-type impurity amount is relatively greater closer to an origin than is "1" (in the drawing (n-rich)), and indicates a state in which a p-type impurity amount is relatively greater further from the origin than is "1" (in the drawing (p-rich)). Further, solid lines represent breakdown voltage and dotted lines represent avalanche resistance.

As depicted in FIG. 6, in the SJ-MOSFET 50 according to the embodiment, avalanche resistance increases more as compared to the conventional SJ-MOSFET 150. Where avalanche resistance is lowest, the charge balance is "1". However, in this state, avalanche resistance is higher than that in the conventional SJ-MOSFET 150.

In the SJ-MOSFET 50 according to the embodiment, the short p-type column regions 41 are provided forming a shape in which portions thereof at bottom parts of the p-type column regions 4 are not provided, whereby increases of the ON resistance due to a junction field effect transistor (JFET) effect, carrier spreading resistance, etc. may be suppressed and thus, the ON resistance decreases. The JFET effect is the spreading of a depletion layer from adjacent channel formation regions (regions where the trenches 18 are in contact with the p-type base region 5) and a narrowing of a current path due to electric field between a source and a drain during MOSFET operation.

Further, in regions where the bottom parts of the p-type column regions 4 are not provided, the charge balance is in a state in which the n-type impurity amount is relatively greater and therefore, a position where avalanche occurs may be guided to the bottom parts of the p-type column regions 4 having the short p-type column regions 41. Therefore, the position where avalanche occurs is located apart from a channel region and current does not concentrate at the channel region, thereby enabling sudden decreases of the avalanche resistance to be suppressed.

Figure 7A:
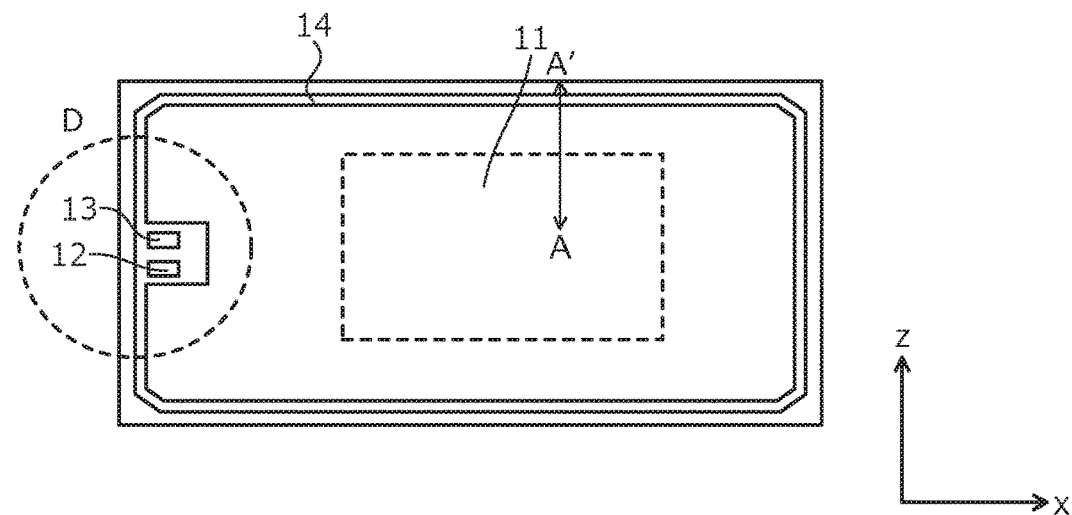
FIG. 7A is a top view of the SJ-MOSFET according to the embodiment.
Figure 7B:
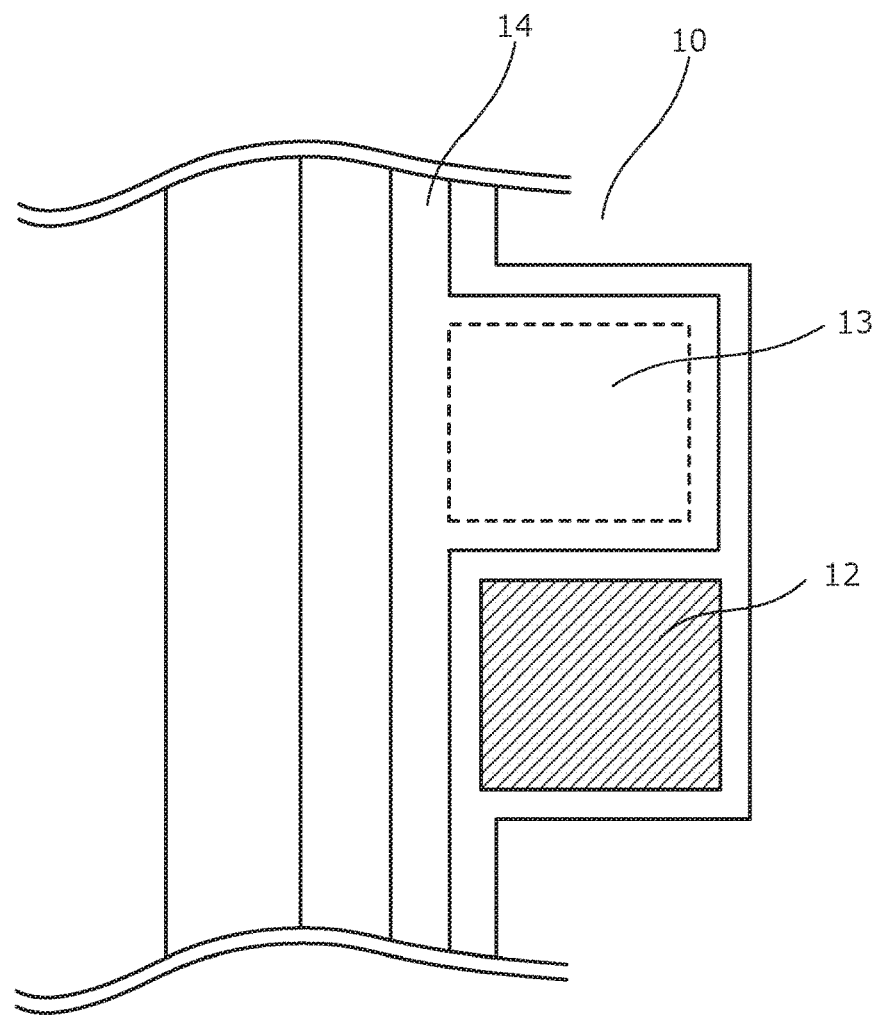
FIG. 7B is an enlarged view of a region D in FIG. 7A.

FIG. 7A is a top view of the SJ-MOSFET according to the embodiment. FIG. 7B is an enlarged view of a region D in FIG. 7A. To enhance reliability of a semiconductor device, a device is proposed that has a high-function structure in which a high-function portion such as a current sensing portion, a temperature sensing portion, and overcurrent protecting portion is disposed on a single semiconductor substrate having a vertical MOSFET that is a main semiconductor element. In a case of a high-function structure, to stabilize and form the high-function portion, in the active region, a region in which only the high-function portion is disposed is provided to be separate from unit cells of the main semiconductor element and near the edge termination region.

FIG. 7A depicts the SJ-MOSFET provided with a current sensing region (current detecting region) 12. In FIG. 7A, the current sensing region 12 is provided at a gate pad region 13 that is separate from the source pad region 11 provided in the active region 30. The source pad region 11 is an opening provided in a protective film such a passivation film provided on the source electrode 10 and is a region where the source electrode 10 is exposed. As depicted in FIG. 7B, the gate pad region 13 is in contact with the gate metal wiring 14 and is electrically connected to the gate electrodes 8. In the current sensing region 12, an external terminal electrode (not depicted) for current detection is provided. Current detection enables a current value to be obtained by connecting external resistors between the external terminal electrode for current detection and the source electrode 10 of the active region, and detecting an electric potential difference between the external resistors.

In the current sensing region 12, a MOS structure similar to that of the active region 30 depicted in FIG. 1 is formed and, similarly to the active region 30, the parallel pn region 20 is provided. In the parallel pn region 20 of the current sensing region 12, the short p-type column regions (third region) 41 and the long p-type column regions (fourth region) 42 are provided in the p-type column regions 4, the length Ls of the short p-type column regions 41 being shorter than the length L of the long p-type column regions 42.

Figure 8:
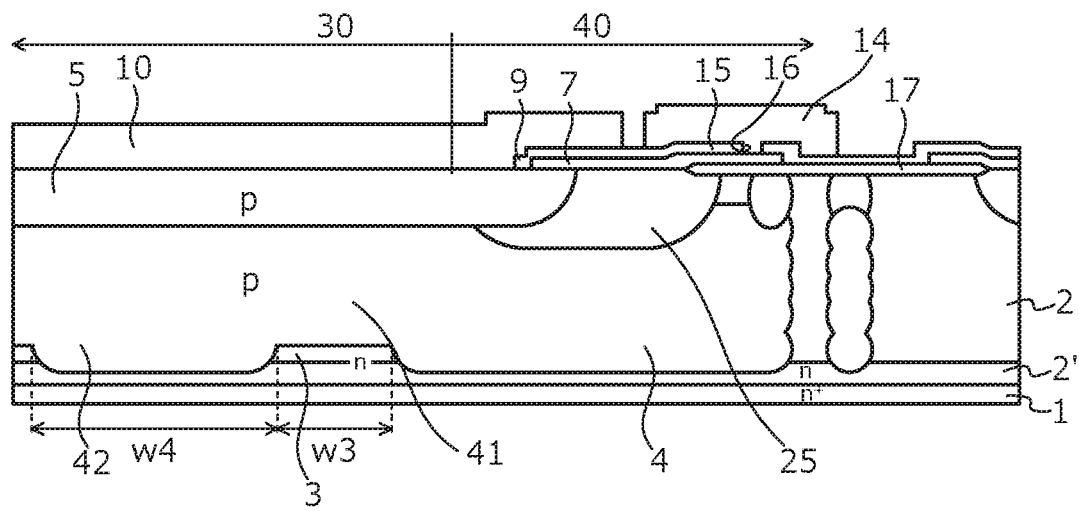
FIG. 8 is a cross-sectional view of a portion along cutting line A-A' in FIG. 7A depicting the structure of the SJ-MOSFET according to the embodiment.
Figure 9:
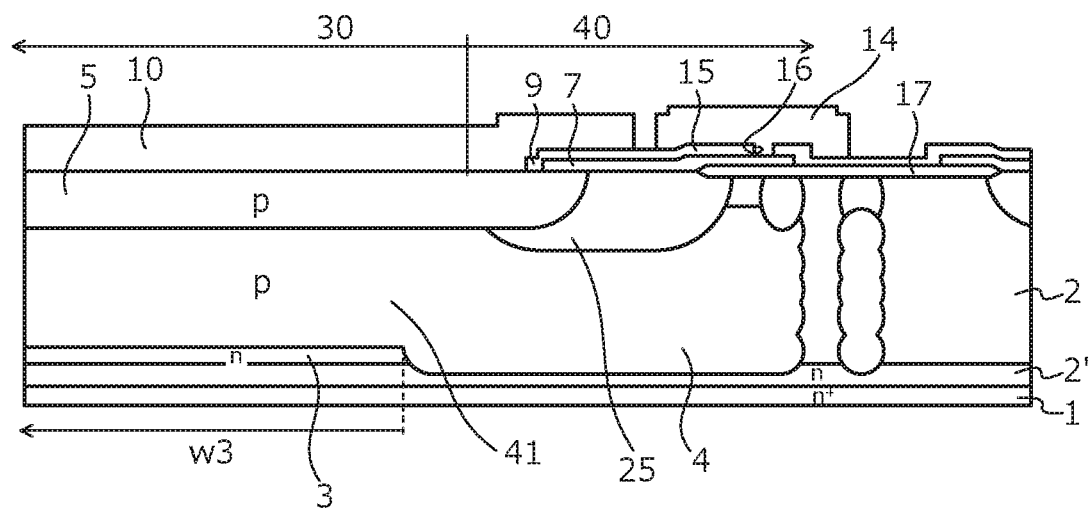
FIG. 9 is a cross-sectional view of a portion along cutting line A-A' in FIG. 7A depicting the structure of the SJ-MOSFET according to the embodiment.

FIGS. 8 and 9 are cross-sectional views of a portion along cutting line A-A' in FIG. 7A depicting the structure of the SJ-MOSFET according to the embodiment. The short p-type column regions 41 are provided to each have the same width w3 and to have equal intervals (interval w4) between the short p-type column regions 41 that are adjacent to each other. The interval w4 and the width w3 of the short p-type column regions 41 are different according to the breakdown voltage rating of the SJ-MOSFET. For example, in a high-voltage device, the interval w4 is increased thereby, enabling a high breakdown voltage to be realized. In particular, in a high-voltage device, the interval w4 may be in a range from 5 µm to 15 µm, and in a low-voltage device, the interval w4 may be in a range from 0.8 µm to 4 µm. The width w3 of the short p-type column regions 41 in p-type column bottom parts of the active region 30 and the interval w4 between the short p-type column regions 41 that are adjacent to each other are substituted into w3/(w3+w4) and the greater is a value thereof, the greater breakdown voltage decreases and capability (avalanche resistance) is enhanced.

Further, as depicted in FIG. 9, in the active region 30, specific columns may be set to be only the short p-type column regions 41. In this case, for example, in a cross-section of the portion along cutting line A-A' in FIG. 1, only the short p-type column region 41 is present in the portion along cutting line A-A' and in the portion along cutting line B-B' adjacent to the portion along cutting line A-A', only the long p-type column region 42 is present.

Figure 10:
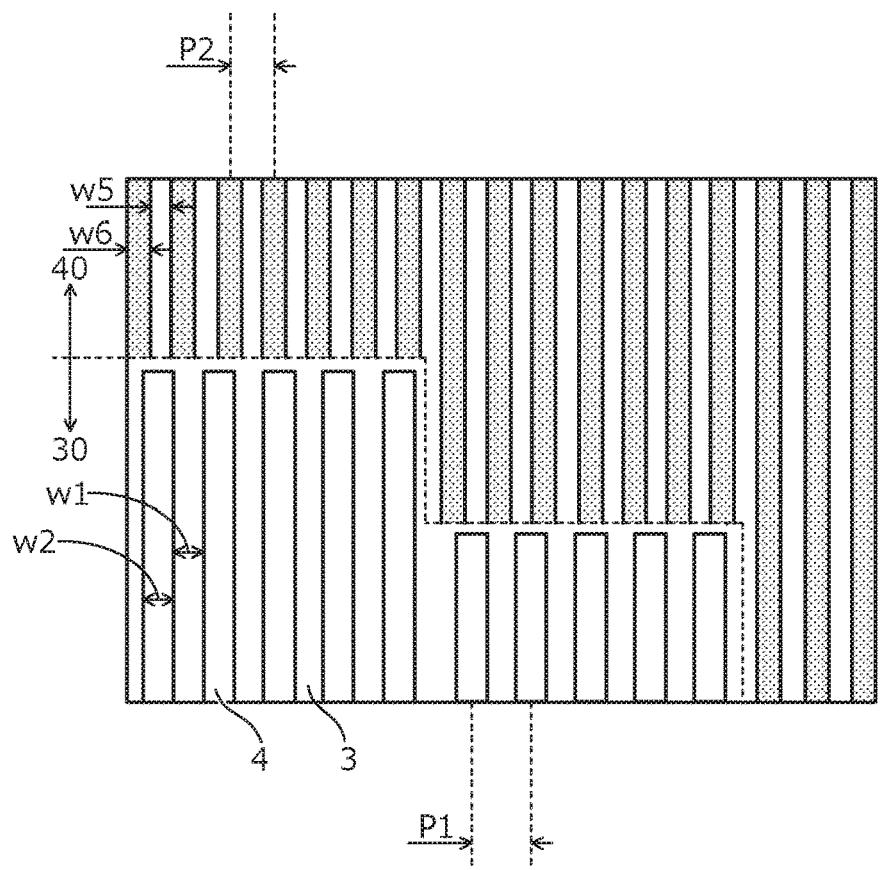
FIG. 10 is a top view of the structure of the SJ-MOSFET according to the embodiment.
Figure 11:
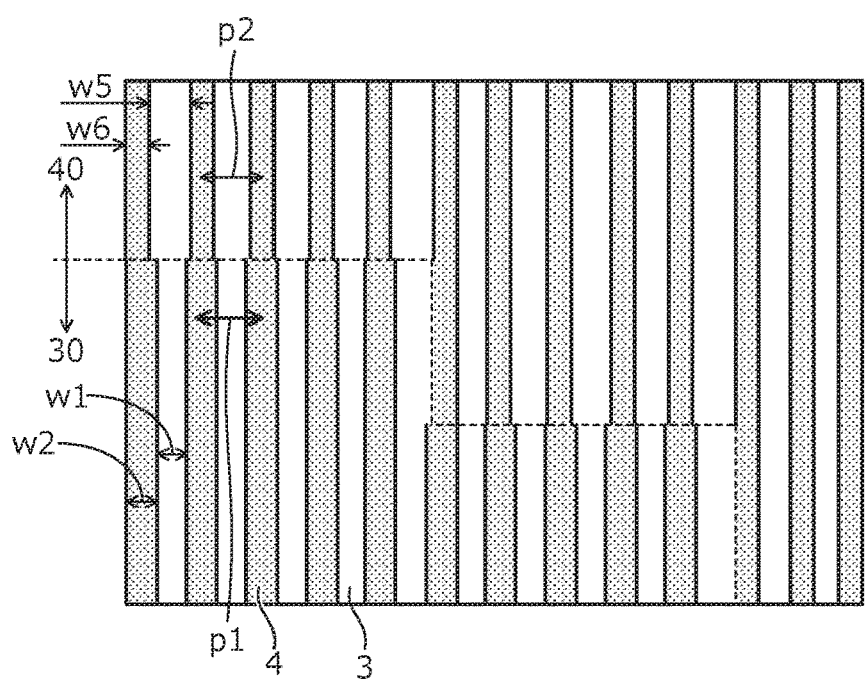
FIG. 11 is a top view of the structure of the SJ-MOSFET according to the embodiment.

FIGS. 10, 11, 12, and 13 are top views of the structure of the SJ-MOSFET according to the embodiment. FIGS. 10 to 13 are top views of a portion in which the n-type column regions 3 and the p-type column regions 4 are provided. As depicted in FIG. 10 and FIG. 11, in the SJ-MOSFET according to the embodiment, in both the active region 30 and the edge termination region 40, the n-type column regions 3 and the p-type column regions 4 may be provided in a striped pattern.

In this case, as depicted in FIG. 10, the width w1 of each of the n-type column regions 3 and the width w2 of each of the p-type column regions 4 in the active region 30 may be made wider than a width w5 of each of the n-type column regions 3 and a width w6 of each of the p-type column regions 4 in the edge termination region 40. As a result, an interval P2 of the p-type column regions 4 of the edge termination region 40 is narrower than the interval P1 of the p-type column regions 4 of the active region 30. The interval P2 of the p-type column regions 4 in the edge termination region 40 is equal to a sum of the width w5 of one of the n-type column regions 3 in the edge termination region 40 and the width w6 of one of the p-type column regions 4 in the edge termination region 40 (P2=w5+w6), and is a pitch at which the n-type column regions 3 and the p-type column regions 4 in the edge termination region 40 repeat. Thus, the interval (pitch) P2 at which the n-type column regions 3 and the p-type column regions 4 in the edge termination region 40 repeat is narrower than the interval (pitch) P1 (P1=w1+w2) at which the n-type column regions 3 and the p-type column regions 4 in the active region 30 repeat. Further, the n-type column region 3 and the p-type column region 4 at a border between the active region 30 and the edge termination region 40 need not be in contact with one another.

Further, as depicted in FIG. 11, the width w2 of the p-type column regions 4 in the active region 30 may be made wider than the width w6 of the p-type column regions 4 in the edge termination region 40. The interval P2 of the p-type column regions 4 (sum of the width w5 of one of the n-type column regions 3 and the width w6 of one of the p-type column regions 4) in the edge termination region 40 and the interval P1 of the p-type column regions 4 (sum of the width w1 of one of the n-type column regions 3 and the width w2 of one of the p-type column regions 4) in the active region 30 are equal. For the capability of the semiconductor device, the breakdown voltage of the edge termination region 40 has to be made higher than the breakdown voltage of the active region 30. Therefore, the impurity concentrations of the p-type column regions 4 and the n-type column regions 3 in the edge termination region 40 may be reduced and the width of the n-type column regions 3 and the width of the p-type column regions 4 may be reduced to facilitate depletion of the edge termination region 40. Further, in the edge termination region 40, a field limiting ring (FLR) structure, a guard ring structure, a RESURF structure, or the like may be provided to mitigate electric field according to shape.

Figure 12:
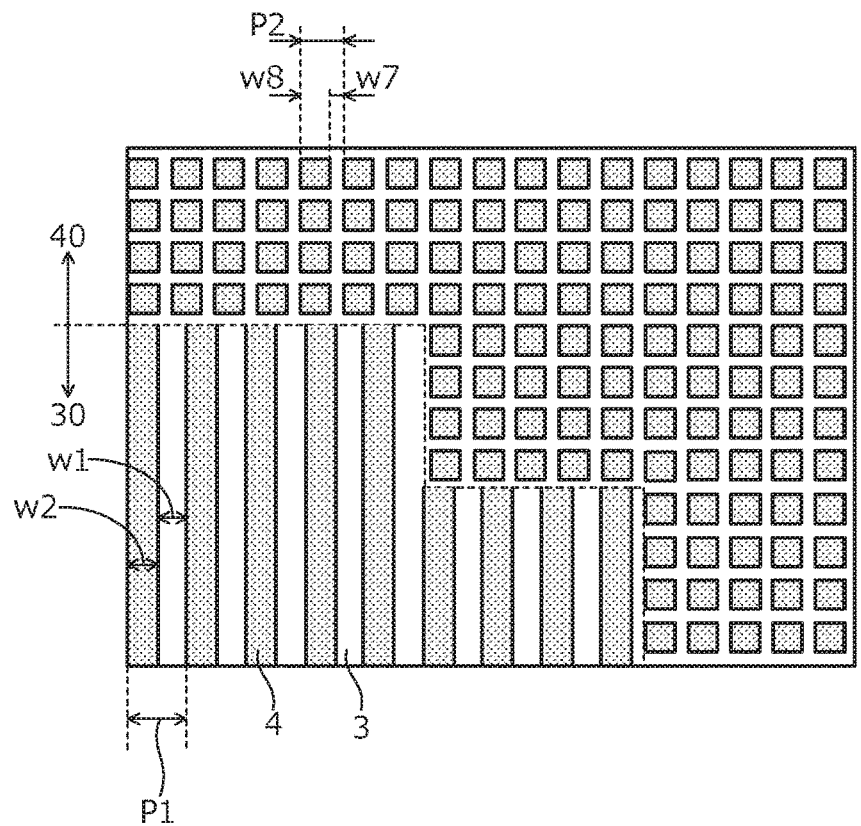
FIG. 12 is a top view of the structure of the SJ-MOSFET according to the embodiment.

Further, as depicted in FIG. 12, in the SJ-MOSFET according to the embodiment, in the active region 30, the n-type column regions 3 and the p-type column regions 4 may be disposed in a striped pattern and in the edge termination region 40, the p-type column regions 4 may be disposed having a rectangular shape such as, for example, a square.

In this case, as depicted in FIG. 12, the width w2 of the p-type column regions 4 in the active region 30 may be made smaller than longitudinal and lateral lengths (width) w8 of a rectangular shape of each of the p-type column regions 4 in the edge termination region 40, and the interval P1 of the p-type column regions 4 (sum of the width w1 of one of the n-type column regions 3 and the width w2 of one of the p-type column regions 4) in the active region 30 may be made a larger length than the interval P2 of the p-type column regions 4 in the edge termination region 40. The interval P2 of the p-type column regions 4 having a rectangular shape is a sum of the width w8 of one of the p-type column regions 4 and a width w7 of one of the n-type column regions 3 adjacent to one of the p-type column regions 4, in a direction orthogonal to the striped pattern. In other words, the interval (pitch) P1 (sum of the width w1 of one of the n-type column regions 3 and the width w2 of one of the p-type column regions 4) at which the n-type column regions 3 and the p-type column regions 4 of the active region 30 repeat is made a larger length than the interval (pitch) P2 (sum of the width w7 of one of the n-type column regions 3 and the width w8 of one of the p-type column regions 4) at which the n-type column regions 3 and the p-type column regions 4 of the edge termination region 40 repeat.

Figure 13:
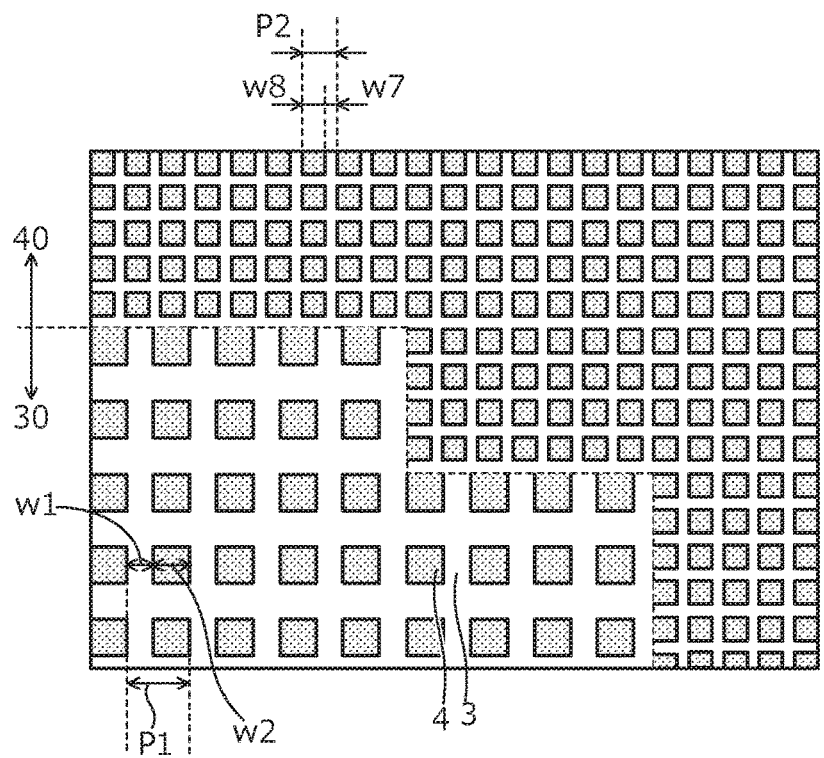
FIG. 13 is a top view of the structure of the SJ-MOSFET according to the embodiment.

Further, as depicted in FIG. 13, in the SJ-MOSFET according to the embodiment, in both the active region 30 and the edge termination region 40, each of the p-type column regions 4 may be provided in a rectangular shape.

In this case, as depicted in FIG. 13, longitudinal and lateral lengths (width) w2 of the rectangular shape of the p-type column regions 4 in the active region 30 may be made larger than the longitudinal and lateral lengths (width) w8 of the rectangular shape of the p-type column regions 4 in the edge termination region 40, and the interval P1 of the p-type column regions 4 in the active region 30 may be made a larger length than the interval P2 of the p-type column regions 4 in the edge termination region 40. In other words, the interval (pitch) P1 (sum of the width w1 of one of the n-type column regions 3 and the width w2 of one of the p-type column regions 4 of the active region 30) at which the n-type column regions 3 and the p-type column regions 4 of the active region 30 repeat is made a larger length than the interval (pitch) P2 (sum of the width w7 of one of the n-type column regions 3 and the width w8 of one of the p-type column regions 4 of the edge termination region 40) at which the n-type column regions 3 and the p-type column regions 4 of the edge termination region 40.

Figure 14:
FIG. 14 is a cross-sectional view of the SJ-MOSFET according to the embodiment during manufacture.

A method of manufacturing a superjunction semiconductor device according to the embodiment will be described. FIGS. 14, 15A, 15B, 16, 17, 18, and 19 are cross-sectional views of the SJ-MOSFET 50 according to the embodiment during manufacture. First, the n$^+$-type semiconductor substrate 1 that forms an n$^+$-type drain layer containing silicon is prepared. Next, on the front surface of the n$^+$-type semiconductor substrate 1, the n-type buffer layer 2' having an impurity concentration lower than the impurity concentration of the n$^+$-type semiconductor substrate 1 is formed by epitaxial growth. The state up to here is depicted in FIG. 14.

Next, on a front side of the n-type buffer layer 2', an n-type layer 2a having an impurity concentration higher than the impurity concentration of the n-type layer 2' is formed by epitaxial growth in which, for example, an n-type impurity is doped so that the impurity concentration of the n-type buffer layer 2' is in a range from $1.0 \times 10^{15}/cm^3$ and $1.0 \times 10^{17}/cm^3$, and the impurity concentration of the n-type layer 2a is in a range from $2.0 \times 10^{15}/cm^3$ to $5.0 \times 10^{15}/cm^3$. The n-type layer 2a may have a thickness that is in a range from 0.5 μm and 40 μm and, for example, in a range from 1 μm and 4 μm in a low-voltage device (semiconductor device having a breakdown voltage of about 100V), and in a range from 6 μm and 20 μm in a high-voltage device (semiconductor device having a breakdown voltage of about 600V).

Figure 15A:
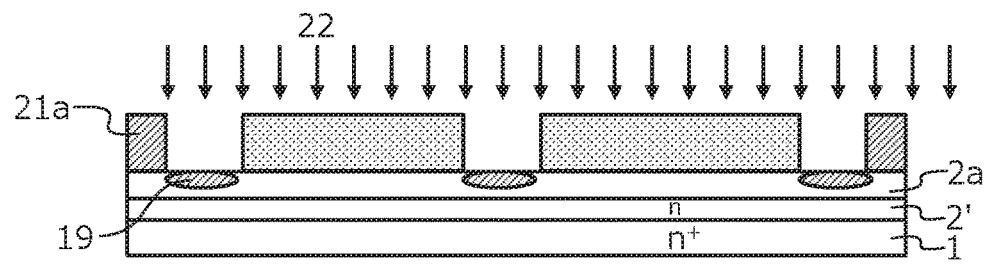
FIG. 15A is a cross-sectional view of the SJ-MOSFET according to the embodiment during manufacture.

Next, on a surface of the n-type layer 2a, an ion implantation mask 21a having openings of a predetermined width is formed by a photolithographic technique using, for example, a photoresist. Here, the ion implantation mask 21a that has openings for the p-type column regions 4 and that prevents impurity ions from being implanted in portions corresponding to the short p-type column regions 41 is formed. An ion implantation 22 of a p-type impurity, for example, boron (B) is performed using the ion implantation mask 21a as a mask, thereby forming p-type regions 19 in a surface layer of the n-type layer 2a. The state up to here is depicted in FIG. 15A. Next, the ion implantation mask is removed.

Figure 15B:
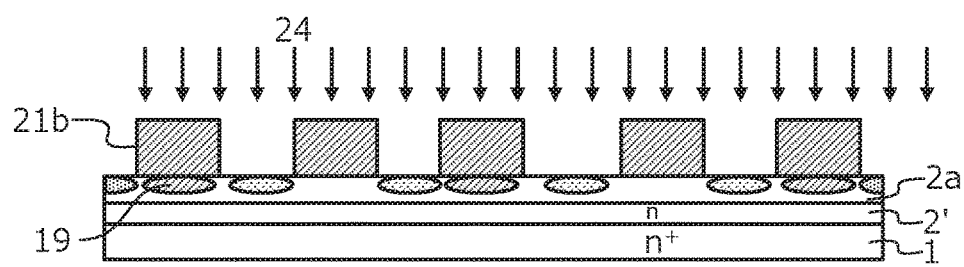
FIG. 15B is a cross-sectional view of the SJ-MOSFET according to the embodiment during manufacture.

Next, on the surface of the n-type layer 2a, an ion implantation mask 21b having openings of a predetermined width is formed by a photolithographic technique using, for example, a photoresist. Here, the ion implantation mask 21b is formed having openings corresponding to the n-type column regions 3. An ion implantation 24 of an n-type impurity, for example, phosphorus (P) or arsenic (As) is performed using the ion implantation mask 21b, thereby forming n-type regions 23 in the surface layer of the n-type layer 2a. The state up to here is depicted in FIG. 15B. Next, the ion implantation mask 21b is removed.

Next, on a front side of the n-type layer 2a, an n-type layer 2b having an impurity concentration equal to the impurity concentration of the n-type layer 2a is formed by epitaxial growth. Next, on a surface of the n-type layer 2b, an ion implantation mask 21c having openings of a predetermined width is formed by a photolithographic technique using, for example, a photoresist. Here, the ion implantation mask 21c is formed having openings corresponding to the p-type column regions 4. The ion implantation 22 of a p-type impurity, for example, boron (B) is performed using the ion implantation mask 21c as a mask, thereby forming the p-type regions 19 in a surface layer of the n-type layer 2b. Next, the ion implantation mask 21c is removed.

Next, on the surface of the n-type layer 2b, an ion implantation mask (not depicted) having openings of a predetermined width is formed by a photolithographic technique using, for example, a photoresist. Here, the ion implantation mask is formed having openings corresponding to the n-type column regions 3. Ion implantation of an n-type impurity using the ion implantation mask as a mask is performed, thereby forming the n-type regions 23 in the surface layer of the n-type layer 2b. Next, the ion implantation mask is removed.

Next, on a front side of the n-type layer 2b, an n-type layer 2c having an impurity concentration equal to the impurity concentration of the n-type layer 2a is formed by epitaxial growth. Next, on a surface of the n-type layer 2c, the ion implantation mask 21c having openings of a predetermined width is formed by a photolithographic technique using, for example, a photoresist. Here, the ion implantation mask 21c having openings corresponding to the p-type column regions 4 is formed. The ion implantation 22 of a p-type impurity, for example, boron (B) is performed using the ion implantation mask 21c as a mask, thereby forming the p-type regions 19 in a surface layer of the n-type layer 2c. Next, the ion implantation mask 21c is removed.

Figure 16:
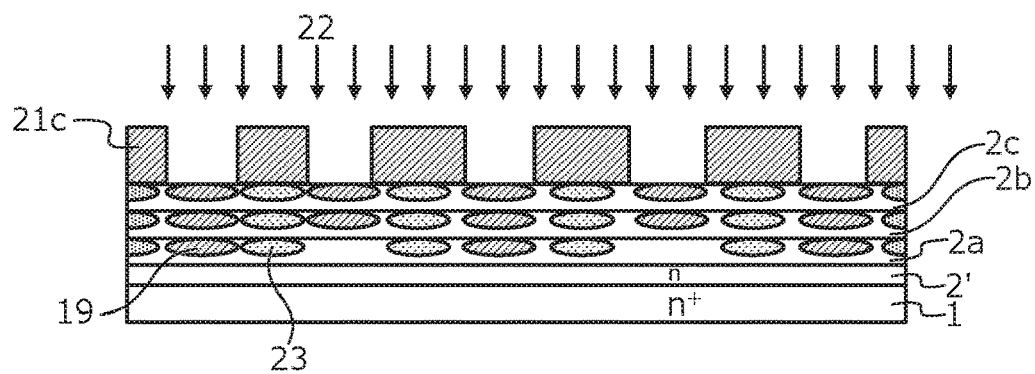
FIG. 16 is a cross-sectional view of the SJ-MOSFET according to the embodiment during manufacture.

Next, on the surface of the n-type layer 2c, an ion implantation mask (not depicted) having openings of a predetermined width is formed by a photolithographic technique using, for example, a photoresist. Here, the ion implantation mask is formed having openings corresponding to the n-type column regions 3. Ion implantation of an n-type impurity is performed using the ion implantation mask as a mask, thereby forming the n-type regions 23 in the surface layer of the n-type layer 2c. The state up to here is depicted in FIG. 16. Next, the ion implantation mask is removed.

Here, in the example depicted in FIG. 16, in the short p-type column regions 41, while one stage of epitaxial growth, i.e., one layer of the n-type layer 2a, has a length shorter than that of the long p-type column regions 42, without limitation hereto, modifications suitable according to a target characteristic such as breakdown voltage are possible.

Next, similarly, an n-type layer 2d and an n-type layer 2e are formed by epitaxial growth, and in surface layers of the n-type layer 2d and the n-type layer 2e, the p-type regions 19 and the n-type regions 23 are formed. As a result, a parallel pn region formed by the n-type regions 23 and the p-type regions 19 is formed. The state up to here is depicted in FIG. 17.

Figure 17:
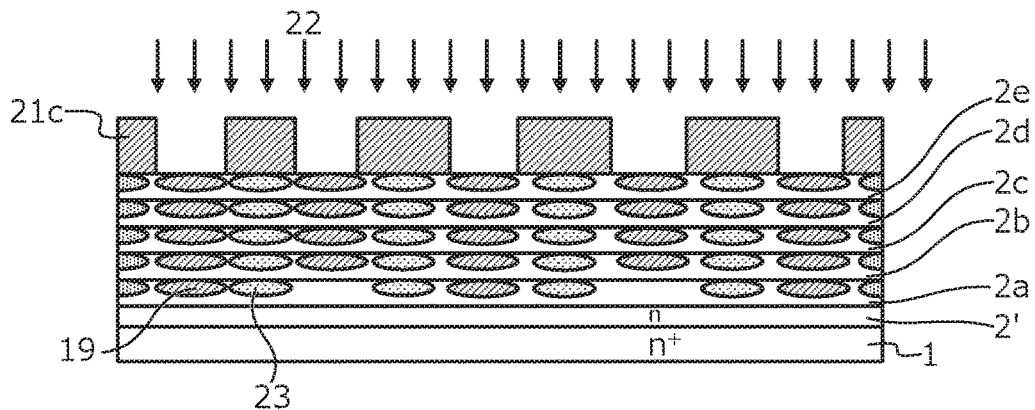
FIG. 17 is a cross-sectional view of the SJ-MOSFET according to the embodiment during manufacture.

In in FIG. 17, while an example is depicted in which ion implantation and epitaxial growth are repeated five times, without limitation hereto, the number of times that the ion implantation and epitaxial growth are repeated may be suitably modified according to a target characteristic such as breakdown voltage. Further, on the n-type layer 2e, an n-type layer (not depicted) may be formed by epitaxial growth. In the active region 30 of this uppermost n-type layer, ion implantation is not performed. By the processes up to here, a region that forms a parallel pn structure is formed by a heat treatment described hereinafter. In the edge termination region 40 of the uppermost n-type layer, on the p-type column regions 4 formed in the n-type layer 2e, ion implantation for forming the p-type region 25 may be performed. The p-type region 25 may have a function of a RESURF region, is deeper than the p-type base regions and has an impurity concentration that is lower than the impurity concentration of the p-type base regions. Further, in the edge termination region 40 of the uppermost n-type layer, ion implantation for forming the n-type regions 23 and the p-type regions 19 for forming the n-type column regions 3 and the p-type column regions 4 may be performed.

Next, a heat treatment for activating the n-type regions 23 and the p-type regions 19 is performed. By this heat treatment, implanted impurities are diffused and the diffused impurities are connected in a vertical direction, whereby the n-type column regions 3 and the p-type column regions 4 are formed. In a high-voltage device, the heat treatment may be performed every two to three times that the ion implantation and epitaxial growth are repeated. Further, in a low-voltage device, the heat treatment may be common a heat treatment for activating the p-type base region 5 and the n$^+$-type source regions 6. In the method of manufacturing a superjunction semiconductor device according to the embodiment, while the ion implantations for forming the n-type column regions 3 and the p-type column regions 4 is performed with respect to the n-type layer 2a, the ion implantations for forming the n-type column regions 3 and the p-type column regions 4 may be performed with respect to the n-type buffer layer 2'. Further, in the method of manufacturing a superjunction semiconductor device according to the embodiment, while the ion implantation for forming the p-type column regions 4 is performed before that for forming the n-type column regions 3, without limitation hereto, the ion implantation for forming the n-type column regions 3 may be performed before that for forming the p-type column regions 4.

Next, on a surface of the n-type layer in the active region 30, a mask having a predetermined opening is formed by a photolithographic technique using, for example, a resist. Subsequently, by an ion implantation method using this resist mask as a mask, a p-type impurity is ion implanted. As a result, in a surface region of the n-type layer, the p-type base region 5 is formed. Next, the mask used during the ion implantation for forming the p-type base region 5 is removed.

Figure 18:
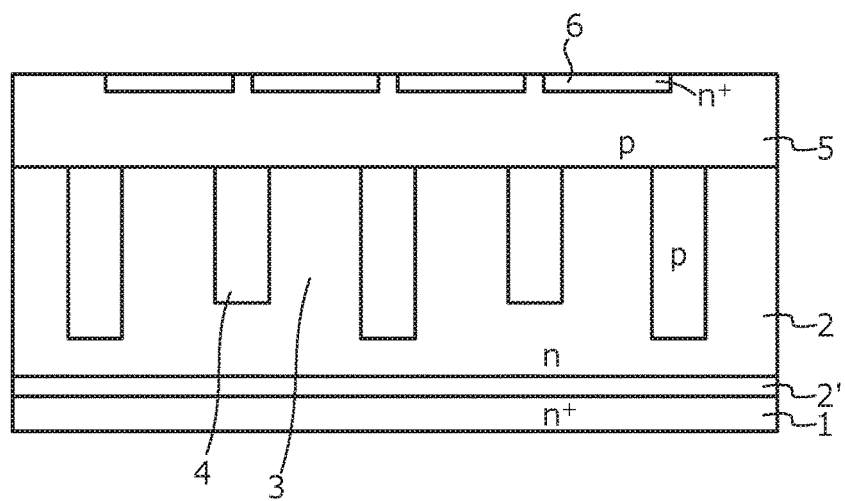
FIG. 18 is a cross-sectional view of the SJ-MOSFET according to the embodiment during manufacture.

Next, on a surface of the p-type base region 5, a mask having predetermined openings is formed by a photolithographic technique using, for example, a resist. Subsequently, an n-type impurity is ion implanted by ion implantation using this resist mask as a mask. As a result, in portions of a surface region of the p-type base region 5, the n$^+$-type source regions 6 are formed. Next, the mask used during the ion implantation for forming the n$^+$-type source regions 6 is removed. The state up to here is depicted in FIG. 18.

Next, a heat treatment for activating the p-type base region 5 and the n$^+$-type source regions 6 is performed. Further, a sequence in which the p-type base region 5 and the n$^+$-type source regions 6 are formed may be variously changed.

Figure 19:
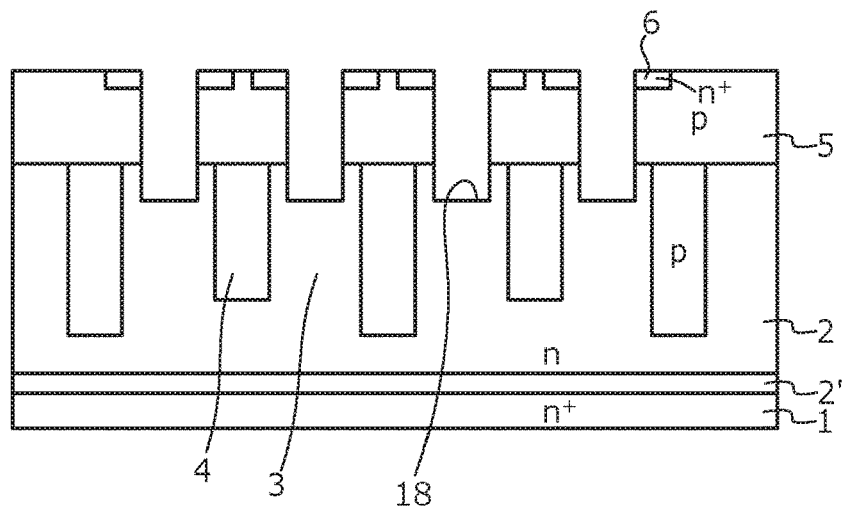
FIG. 19 is a cross-sectional view of the SJ-MOSFET according to the embodiment during manufacture.

Next, on the surface of the p-type base region 5 and surfaces of the n$^+$-type source regions 6, a mask having predetermined openings is formed by photolithography using, for example, an oxide film. Next, by dry etching, the trenches 18 that penetrate the n$^+$-type source regions 6 and reach the n-type column regions 3 are formed. Next, the trench formation mask is removed. The state up to here is depicted in FIG. 19. After formation of the trenches 18, the n$^+$-type source regions 6 may be formed.

Next, along the surfaces of the n$^+$-type source regions 6 and the bottoms and the side walls of the trenches 18, the gate insulating film 7 is formed. The gate insulating film 7 may be formed by thermal oxidation of a temperature of about 1000 degrees C. in an oxygen atmosphere. Further, the gate insulating film 7 may be formed by a deposition method using a chemical reaction such as that for a high temperature oxide (HTO).

Next, on the gate insulating film 7, a polycrystalline silicon layer doped with, for example, phosphorus atoms is provided. The polycrystalline silicon layer may be formed to be embedded in the trenches 18. The polycrystalline silicon layer is patterned by photolithography and left in the trenches 18, thereby forming the gate electrodes 8.

Next, for example, a phosphate glass is deposited to a thickness of about 1 μm so as to cover the gate insulating film 7 and the gate electrodes 8, thereby forming the interlayer insulating film 9. Next, the interlayer insulating film 9 and the gate insulating film 7 are patterned by photolithography, thereby forming contact holes that expose the n$^+$-type source regions 6 and the p-type base region 5. Thereafter, a heat treatment (reflow) is performed, thereby planarizing the interlayer insulating film 9.

Next, by sputtering, the source electrode 10 is deposited. The source electrode 10 is patterned by photolithography and etching. Before the source electrode 10 is deposited, a barrier metal (not depicted) formed by a titanium film (Ti), a titanium nitride film (TiN), or a stacked film thereof (for example, Ti/TiN) may be formed by sputtering. Thereafter, the source electrode 10 is deposited on the barrier metal by sputtering; and the source electrode 10 and the barrier metal (not depicted) are patterned by photolithography and etching. Next, the source electrode 10 is embedded in the contact holes, whereby the n$^+$-type source regions 6 and the source electrode 10 are electrically connected. In the contact holes, a tungsten plug, etc. may be embedded on the barrier metal.

Next, on a surface (back surface of the semiconductor base) of the n$^+$-type semiconductor substrate 1, for example, a metal film of nickel (Ni), titanium (Ti), gold (Au), aluminum (Al), or an aluminum alloy, or a stacked film thereof (for example, Ti/Ni/Au, Al/Ti/Ni/Au, etc.) is deposited as the drain electrode (not depicted). Subsequently, a heat treatment is performed, thereby forming an ohmic contact between the n$^+$-type semiconductor substrate 1 and the drain electrode. As a result, the SJ-MOSFET 50 depicted in FIG. 1 is completed.

Figure 20:
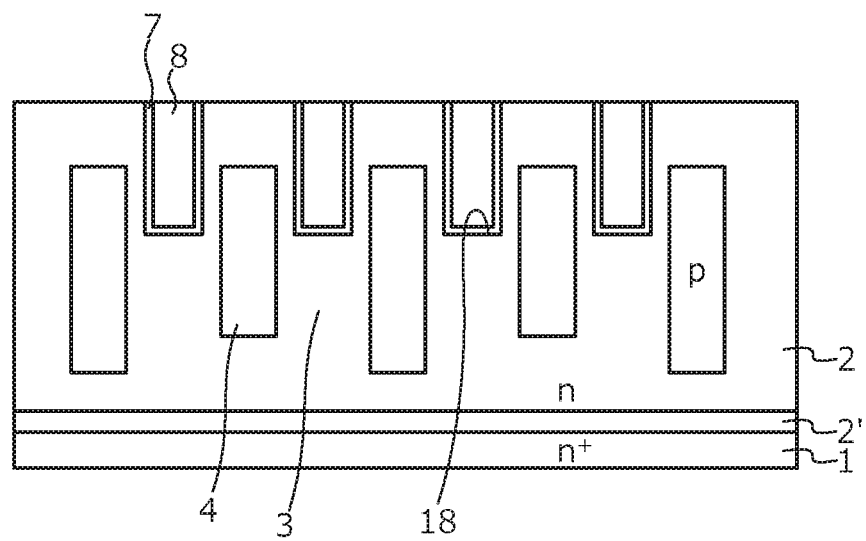
FIG. 20 is a cross-sectional view of the SJ-MOSFET according to an embodiment during manufacture.
Figure 21:
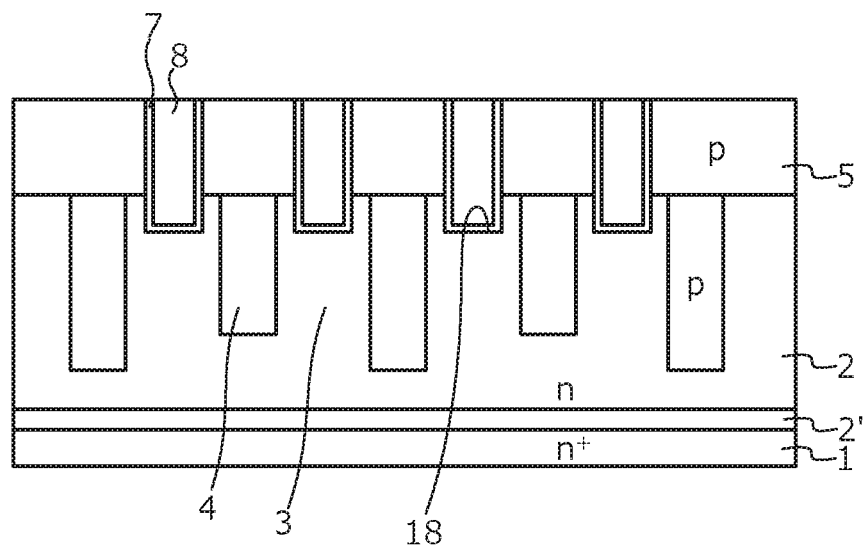
FIG. 21 is a cross-sectional view of the SJ-MOSFET according to an embodiment during manufacture.
Figure 22:
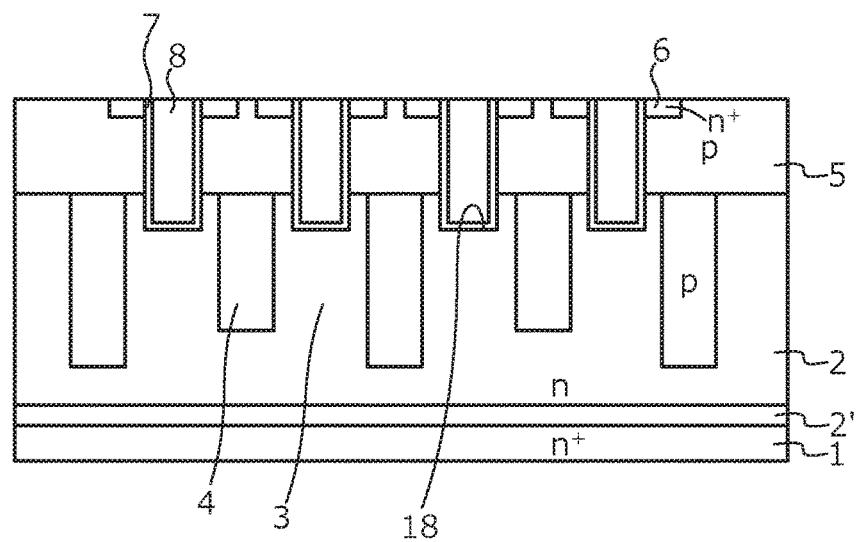
FIG. 22 is a cross-sectional view of the SJ-MOSFET according to an embodiment during manufacture.

FIGS. 20, 21, and 22 are cross-sectional views of the SJ-MOSFET 50 according to another embodiment during manufacture by the method depicted in FIGS. 18 and 19.

As depicted in FIGS. 14 to 17, the same processes of the method are performed and the (uppermost) n-type layer (not depicted) is formed on the n-type layer 2e by epitaxial growth. In the active region 30 of the uppermost n-type layer, the ion implantation is not performed. In the edge termination region 40 of the uppermost n-type layer, on the p-type column regions 4 formed in the n-type layer 2e, ion implantation may be performed forming the p-type region 25 that overlaps the RESURF region. Further, in the edge termination region 40 of the uppermost n-type layer, the ion implantation for forming the n-type regions 23 and the p-type regions 19 for forming the n-type column regions 3 and the p-type column regions 4 may be performed. The heat treatment for activating the n-type regions 23 and the p-type regions 19 is performed. By this heat treatment, implanted impurities are diffused and the diffused impurities are connected in the vertical direction, whereby the n-type column regions 3 and the p-type column regions 4 are formed.

Next, on the uppermost n-type layer, a mask having predetermined openings is formed by photolithography using, for example, an oxide film. Next, by dry etching, the trenches 18 that reach the n-type column regions 3 are formed. Next, the trench formation mask is removed.

Next, along the surface of the uppermost n-type layer and the bottoms and the side walls of the trenches 18, the gate insulating film 7 is formed. The gate insulating film 7 may be formed by thermal oxidation of a temperature of about 1000 degrees C. in an oxygen atmosphere. Further, the gate insulating film 7 may be formed by a deposition method using a chemical reaction such as that for a high temperature oxide (HTO).

Next, on the gate insulating film 7, the polycrystalline silicon layer doped with, for example, phosphorus atoms is provided. The polycrystalline silicon layer may be formed so as to be embedded in the trenches 18. The polycrystalline silicon layer is patterned by photolithography and is left in the trenches 18, thereby forming the gate electrodes 8. The state up to here is depicted in FIG. 20.

Next, on a surface of the uppermost n-type layer on the active region 30 side thereof, a mask having predetermined openings is formed by a photolithographic technique using, for example, a resist. Subsequently, a p-type impurity is ion implanted by ion implantation using the resist mask as a mask. As a result, in a surface region of the n-type layer, the p-type base region 5 is formed. Next, the mask used during the ion implantation for forming the p-type base region 5 is removed. Next, the heat treatment for activating the p-type base region 5 is performed. The state up to here is depicted in FIG. 21.

Next, on the surface of the p-type base region 5, a mask having predetermined openings is formed by a photolithographic technique using, for example, a resist. Subsequently, an n-type impurity is ion implanted by ion implantation using this resist mask as a mask. As a result, in portions of a surface region of the p-type base region 5, the $n^+$-type source regions 6 are formed. Further, the mask used during the ion implantation for forming the $n^+$-type source regions 6 is removed. Next, the heat treatment for activating the $n^+$-type source regions 6 is performed. The state up to here is depicted in FIG. 22.

Next, for example, a phosphate glass is deposited to a thickness of about 1 µm so as to cover the gate insulating film 7 and the gate electrodes 8, thereby forming the interlayer insulating film 9. Next, the interlayer insulating film 9 and the gate insulating film 7 are patterned by photolithography, thereby forming contact holes that expose the $n^+$-type source regions 6 and the p-type base region 5. Thereafter, the heat treatment (reflow) is performed, thereby planarizing the interlayer insulating film 9.

Next, by sputtering, the source electrode 10 is deposited. The source electrode 10 is patterned by photolithography and etching. Before the source electrode 10 is formed, the barrier metal (not depicted) that is formed by a titanium film (Ti), a titanium nitride film (TiN), or a stacked film thereof (for example, Ti/TiN) may be formed by sputtering. Thereafter, on the barrier metal, the source electrode 10 is formed by sputtering; and the source electrode 10 and the barrier metal (not depicted) are patterned by photolithography and etching. Next, the source electrode 10 is embedded in the contact holes, thereby the $n^+$-type source regions 6 and the source electrode 10 are electrically connected. In the contact holes, a tungsten plug, etc. may be embedded on the barrier metal.

Next, on the surface (back surface of the semiconductor base) of the $n^+$-type semiconductor substrate 1, for example, a metal film of nickel (Ni), titanium (Ti), gold (Au), aluminum (Al), or an aluminum alloy, or a stacked film thereof (for example, Ti/Ni/Au, Al/Ti/Ni/Au, etc.) is deposited as the drain electrode (not depicted). Subsequently, the heat treatment is performed, thereby forming the ohmic contact between the $n^+$-type semiconductor substrate 1 and the drain electrode. As a result, the SJ-MOSFET 50 depicted in FIG. 1 is completed.

As described above, according to the embodiment, in the parallel pn region of the active region, short p-type column regions having a length that is short from upper surfaces of the p-type column regions to the bottom surfaces of the p-type column regions are selectively provided. As a result, in regions where the short p-type column regions of the parallel pn region are provided, the charge balance is in a state in which an n-type impurity amount is relatively greater and the position where avalanche occurs may be guided to the bottom parts of the p-type column regions other than the long p-type column regions. Therefore, the position where avalanche occurs is located apart from the channel region and current does not concentrate at the channel region, thereby enabling sudden decreases of the avalanche resistance to be suppressed.

In the foregoing, while a case in which MOS gate structures are configured on a first main surface of the silicon substrate is described as an example, without limitation hereto, various modifications such as the type (for example, silicon carbide (SiC), etc.) of the semiconductor material, orientation of the substrate main surface, etc. are possible. Further, in the embodiment of the invention, while a trench-type MOSFET is described as an example, without limitation hereto, application is further possible to semiconductor devices of various types of MOS-type semiconductor device configurations such as planar-type MOSFETs, IGBTs, etc. Further, in the embodiments, while the first conductivity type is an n-type and a second conductivity type is a p-type, the present invention is similarly implemented when the first conductivity type is a p-type and the second conductivity type is an n-type.

In the invention described above, in the parallel pn region of the active region, the long p-type column regions having a predetermined length from the upper surfaces of the p-type column regions to the bottoms surfaces of the p-type column regions, the short p-type column regions having a length from the upper surfaces of the p-type column regions to the bottom surfaces of the p-type column regions, a length that is shorter than the length of the long p-type column regions are selectively provided. As a result, in regions where the short p-type column regions of the parallel pn region are provided, the charge balance is in a state in which an n-type impurity amount is relatively greater and the position where avalanche occurs may be guided to the bottoms parts of the short p-type column regions. Therefore, the position where avalanche occurs is located apart from the channel region and current does not concentration in the channel region, thereby enabling sudden decreases in the avalanche resistance to be suppressed.

The superjunction semiconductor device and the method of manufacturing a superjunction semiconductor device according to the present invention achieve an effect in that even when the charge balance is in a state of "1", decreases in the avalanche resistance may be achieved.

As described above, the superjunction semiconductor device and the method of manufacturing a superjunction semiconductor device according to the present invention are useful for high-voltage semiconductor devices used in power converting equipment, and for power source devices such as in power converting devices and industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A superjunction semiconductor device having an active region through which current passes, and an edge termination structure region disposed at an outer side of the active region and in which a voltage withstanding structure that surrounds a periphery of the active region is formed, the superjunction semiconductor device comprising:
    a semiconductor substrate of a first conductivity type, having a front surface and a back surface opposite to the front surface;
    a first semiconductor layer of the first conductivity type, provided on the front surface of the semiconductor substrate and having an impurity concentration that is lower than an impurity concentration of the semiconductor substrate;
    a parallel pn structure provided on a surface of the first semiconductor layer and including a plurality of first columns of the first conductivity type and a plurality of second columns of a second conductivity type, the first columns of the plurality of first columns and the second columns of the plurality of second columns being disposed to repeatedly alternate with one another on a plane parallel to the front surface;
    a first semiconductor region of the second conductivity type, provided on a surface of the parallel pn structure in the active region;
    a second semiconductor region of the first conductivity type, selectively provided in a surface layer of the first semiconductor region in the active region;
    a gate insulating film having a first surface in contact with the first semiconductor region and a second surface opposite to the first surface; and
    a gate electrode provided on the second surface of the gate insulating film, wherein
    the active region includes second columns among the second columns of the plurality of second columns, and each second column in the active region includes a plurality of first-second column regions and a plurality of second-second column regions that are disposed so that the first-second column regions of the plurality of first-second column regions and the second-second column regions of the plurality of second-second column regions repeatedly alternate with one another in a single line in an extending direction in which each of the second columns extends,
    each of the first-second column regions of the plurality of first-second column regions has a first bottom and each of the second-second column regions of the plurality of second-second column regions has a second bottom, and
    a first distance from the front surface of the semiconductor substrate to the first bottom of each of the first-second column regions of the plurality of first-second column regions is greater than a second distance from the front surface of the semiconductor substrate to the second bottom of each of the second-second column regions the plurality of second-second column regions.

2. The superjunction semiconductor device according to claim 1, further comprising:
    a trench penetrating the first semiconductor region and the second semiconductor region, and reaching a corresponding one of the at least one first column, wherein
    the gate electrode is provided on the gate insulating film in the trench.

3. The superjunction semiconductor device according to claim 1, wherein
    the plurality of second-second column regions is disposed in alignment, with a constant interval between each adjacent two of the second-second column regions of the plurality of second-second column regions.

4. The superjunction semiconductor device according to claim 1, further comprising:
    a current detecting region having the first semiconductor layer, the parallel pn structure, the first semiconductor region, the second semiconductor region, the gate insulating film, and the gate electrode, wherein
    the current detecting region includes a second column different from those in the active region among the plurality of second columns, and the second column in the current detection region includes a third-second column region having a third bottom and a fourth-second column region having a fourth bottom, a third distance from the front surface of the semiconductor substrate to the third bottom of the third-second column region is greater than a fourth distance from the front surface of the semiconductor substrate to the fourth bottom of the fourth-second column region.

5. The superjunction semiconductor device according to claim 1, wherein
    a volume of the second columns in the active region is at least 90% of a volume of the plurality of first columns in the active region.

6. A method of manufacturing a superjunction semiconductor device having an active region through which current passes, and an edge termination structure region disposed at an outer side of the active region and in which a voltage withstanding structure that surrounds a periphery of the active region is formed, the method comprising:
    forming a first semiconductor layer of a first conductivity type on a front surface of a semiconductor substrate of the first conductivity type, the first semiconductor layer having an impurity concentration lower than an impurity concentration of the semiconductor substrate;
    forming a parallel pn structure on a surface of the first semiconductor layer, the parallel pn structure including a plurality of first columns of the first conductivity type and a plurality of second columns of a second conductivity type, the first columns of the plurality of first columns and the second columns of the plurality of second columns being disposed to repeatedly alternate with one another on a plane parallel to the front surface;
    forming a first semiconductor region of the second conductivity type, on a surface of the parallel pn structure in the active region;
    selectively forming a second semiconductor region of the first conductivity type, in a surface layer of the first semiconductor region in the active region;
    forming a gate insulating film having a first surface in contact with the first semiconductor region and a second surface opposite to the first surface; and
    forming a gate electrode on the second surface of the gate insulating film, wherein
    the active region includes second columns among the second columns of the plurality of second columns and each second column in the active region includes a plurality of first-second column regions and a plurality of second-second column regions that are disposed so that the first-second column regions of the plurality of first-second column regions and the second-second column regions of the plurality of second-second column regions repeatedly alternate with one another in one single line in an extending direction in which each of the second columns extends, each of the first-second column regions of the plurality of first-second column regions has a first bottom and each of the second-second column regions of the plurality of second-second column regions has a second bottom, and a first distance from the front surface of the semiconductor substrate to the first bottom of each of the first-second column regions of the plurality of first-second column regions is greater than a second distance from the front surface of the semiconductor substrate to the second bottom of each of the second-second column regions of the plurality of second-second column regions.

7. A method of manufacturing a superjunction semiconductor device having an active region through which current passes, and an edge termination structure region disposed at an outer side of the active region and in which a voltage withstanding structure that surrounds a periphery of the active region is formed, the method comprising:

forming a first semiconductor layer of a first conductivity type on a front surface of a semiconductor substrate of the first conductivity type, the first semiconductor layer having an impurity concentration lower than an impurity concentration of the semiconductor substrate;

forming a parallel pn structure on a surface of the first semiconductor layer, the parallel pn structure including a plurality of first columns of the first conductivity type and a plurality of second columns of a second conductivity type, the first columns of the plurality of first columns and the second columns of the plurality of second columns being disposed to repeatedly alternate with one another on a plane parallel to the front surface;

forming a plurality of trenches from an upper surface of the parallel pn structure in the active region, in a direction toward the semiconductor substrate to selectively reach the plurality of first columns;

forming a gate insulating film along a contour of each of the plurality of trenches;

forming a plurality of gate electrodes on a surface of the gate insulating film;

forming a first semiconductor region of the second conductivity type, on a surface of the parallel pn structure in the active region, the first semiconductor region having a surface layer on a first side thereof opposite a second side thereof facing the semiconductor substrate; and selectively forming a plurality of second semiconductor regions of the first conductivity type, in the surface layer of the first semiconductor region so that each is in contact with a corresponding trench of the plurality of trenches, wherein the active region includes second columns among the second columns of the plurality of second columns and each second column in the active region includes a plurality of first-second column regions and a plurality of second-second column regions, the respective first-second column regions and second-second column regions of which are disposed to repeatedly alternate with one another in one single line in an extending direction in which each of the second columns extends, each of the first-second column regions of the plurality of first-second column regions has a first bottom and each of the second-second column regions of the plurality of second-second column regions has a second bottom, and a first distance from the front surface of the semiconductor substrate to the first bottom of each of the first-second column regions of the plurality of first-second column regions is greater than a second distance from the front surface of the semiconductor substrate to the second bottom of each of the second-second column regions of the plurality of second-second column regions.

8. The superjunction semiconductor device according to claim 1, wherein centers in the extending direction of the second-second column regions of the plurality of second-second column regions included in one of the second columns of the active region are respectively aligned, in a direction orthogonal to the extending direction, with respective ones of centers in the extending direction of the first-second column regions of the plurality of first-second column regions included in an other of the second columns of the active region.

9. The superjunction semiconductor device according to claim 1, wherein the first-second column regions of the plurality of first-second column regions included in a same second column of the active region have lengths in the extending direction that are the same as each other, and the second-second column regions of the plurality of second-second column regions included in a same second column of the active region have lengths in the extending direction that are the same as each other.

10. The superjunction semiconductor device according to claim 1, wherein a difference between the first distance and the second distance is in a range from 1.2 μm to 1.8 μm.

11. The method of manufacturing a superjunction semiconductor device according to claim 6, wherein centers in the extending direction of the second-second column regions of the plurality of second-second column regions included in one of the second columns of the active region are respectively aligned, in a direction orthogonal to the extending direction, with respective ones of centers in the extending direction of the first-second column regions of the plurality of first-second column regions included in an other of the second columns of the active region.

12. The method of manufacturing a superjunction semiconductor device according to claim 6, wherein the first-second column regions of the plurality of first-second column regions included in a same second column of the active region have lengths in the extending direction that are the same as each other, and the second-second column regions of the plurality of second-second column regions included in a same second column of the active region have lengths in the extending direction that are the same as each other.

13. The method of manufacturing a superjunction semiconductor device according to claim 7, wherein centers in the extending direction of the second-second column regions of the plurality of second-second column regions included in one of the second columns of the active region are respectively aligned, in a direction orthogonal to the extending direction, with respective ones of centers in the extending direction of the first-second column regions of the plurality of first-second column regions included in an other of the second columns of the active region.

14. The method of manufacturing a superjunction semiconductor device according to claim 7, wherein the first-second column regions of the plurality of first-second column regions included in a same second column of the active region have lengths in the extending direction that are the same as each other, and the second-second column regions of the plurality of second-second column regions included in a same second column of the active region have lengths in the extending direction that are the same as each other.

* * * * *